(12) United States Patent
Wong

(10) Patent No.: US 6,590,423 B1
(45) Date of Patent: Jul. 8, 2003

(54) DIGITAL CIRCUITS EXHIBITING REDUCED POWER CONSUMPTION

(76) Inventor: Derek Wong, 1341 Echo Valley Dr., San Jose, CA (US) 95120

(*) Notice: Subject to any disclaimer, the term of this patent is extended or adjusted under 35 U.S.C. 154(b) by 0 days.

(21) Appl. No.: 08/817,242

(22) PCT Filed: Oct. 11, 1994

(86) PCT No.: PCT/US94/11520

§ 371 (c)(1),
(2), (4) Date: Apr. 14, 1997

(87) PCT Pub. No.: WO96/11530

PCT Pub. Date: Apr. 18, 1996

(51) Int. Cl.[7] .............................................. H03K 19/00
(52) U.S. Cl. ............................ 326/93; 326/94; 326/95; 326/97; 326/98
(58) Field of Search ............................. 326/93, 95, 98, 326/94, 97; 327/202, 203

(56) References Cited

U.S. PATENT DOCUMENTS

| | | | | |
|---|---|---|---|---|
| 4,554,467 A | * | 11/1985 | Vaughn | 327/211 |
| 4,570,084 A | * | 2/1986 | Griffin et al. | 326/98 |
| 4,684,829 A | * | 8/1987 | Uratani | 326/106 |
| 4,733,111 A | * | 3/1988 | Fassino et al. | 327/203 |
| 4,820,939 A | * | 4/1989 | Sowell et al. | 327/141 |
| 5,248,905 A | * | 9/1993 | Kuo | 326/93 |
| 5,280,203 A | * | 1/1994 | Hung et al. | 326/37 |
| 5,467,038 A | * | 11/1995 | Motley et al. | 327/185 |
| 5,475,320 A | * | 12/1995 | Ko | 326/21 |
| 5,491,444 A | * | 2/1996 | McClure | 327/525 |
| 5,552,738 A | * | 9/1996 | Ko | 327/203 |
| 6,026,011 A | * | 2/2000 | Zhang | 365/154 |

* cited by examiner

Primary Examiner—Michael G. Lee
Assistant Examiner—Steven S. Paik

(57) ABSTRACT

A method of using low voltage-swing clocks (512) with CMOS latches (502–522, 504–524) and with bi-CMOS latches (904–914, 906–916) and associated circuit structures to reduce power requirements of these circuits compared to conventional CMOS and bi-CMOS circuits. Also, a method of using low voltage-swing clocks (1136) to control CMOS (FIG. 11) and bi-CMOS dynamic logic. The power consumption of CMOS and bi-CMOS microprocessors and other chips can be substantially reduced by using low voltage-swing clocks, with savings of up to 60% to 80% of the normal clock power at speeds comparable to using normal latches and dynamic logic gates, with noise margins sufficient for safe operation.

6 Claims, 11 Drawing Sheets

DIGITAL CIRCUITS EXHIBITING REDUCED POWER CONSUMPTION

BACKGROUND OF THE INVENTION

This invention is directed to digital circuits that exhibit a reduced power consumption compared to conventional digital circuits, systems, and sub-systems of the same functionality. Power consumption of VLSI chips is becoming an increasingly critical problem as chip densities increase. In 1989–90, CMOS microprocessors generally consumed 5 W of power or less, but by 1992–94, many designs consume about 15 to 30 W. Such levels of power consumption produce device temperatures that can degrade performance of such circuits as well as decrease their lifetimes. Therefore, increased power consumption by circuits requires increasingly powerful and/or efficient cooling systems to keep their temperatures within proper limits, thereby increasing the total cost of these devices.

In portable systems, very low power consumption is desired in order to increase battery life and because the tight spacing within the housing of such portable systems limits any cooling methods for such systems.

Most of the power utilized in a digital CMOS circuit is consumed in switching the states of circuit nodes. Each state transition of a node consumes an amount of energy that is typically proportional to the square of the voltage difference between the on and off states of that node. The power consumed by state switching is therefore substantially equal to the product of the rate at which such states are switched and the energy required to achieve each such change of state. Today's low-power design techniques therefore focus on the following approaches: (i) using a lower supply voltage to reduce the energy required per state change; (ii) using low-voltage swing signalling techniques at the chip I/O pins to reduce the energy required for each transition at a chip I/O pin; (iii) keeping input signals to unused circuits stable in order to reduce the average rate of switching; (iv) lowering clock frequency to reduce the average rate of switching; aid (v) stopping the clock when the circuit is idling in order to reduce the average rate of switching.

Unfortunately, as indicated in A. P. Chandrakasan, S. Sheng, and R. W. Brodersen. "Low-Power CMOS Digital Design." April 1992, IEEE Journal of Solid-State Circuits, pp. 473–484, vol. 27, no. 4., D. Liu and C. Svensson. "Trading Speed for Low Power by Choice of Supply and Threshold Voltages." January 1993, IEEE Journal of Solid-State Circuits, pp. 10–17, vol. 28, no. 1, and K. Shimohigashi and K Seki. "Low-Voltage ULSI Design." April 1993, IEEE Journal of Solid-State Circuits, pp. 408–413, vol. 28, no. 4., which reduce circuit power consumption by utilizing power supplies providing reduced voltages, lowering the power supply voltage can reduce the speed of such circuits.

Signals having a substantially smaller signal swing than signals conventionally utilized in a digital circuit design style are referred to herein as "low-swing signals". For example, in static CMOS, this means the use of gating signals that are lower than a supply voltage $V_{DD}$ provided to this circuit. Such signals are preferably at least 14% less than $V_{DD}$ so that a power reduction of at least 25% is achieved. The selective use of such low-swing signals will be referred to herein as "selective, low-swing signalling".

In a circuit using selective, low-swing signalling, some signal lines operate using normal signal swings while others operate at low swings. For example, in typical CMOS circuits, normal signal swings have a high output voltage equal to the supply voltage $V_{DD}$ and a low output voltage equal to the ground voltage GND. GND is typically defined to be 0 volts. In typical ECL circuits, normal signal swings are typically 500 mV or 600 mV for single-ended signals.

As taught in B. A- Chappell, T. I. Chappell, et al. "Fast CMOS ECL Receivers with 100-mV Worst-Case Sensitivity." February 1988, IEEE Journal of Solid-State Circuits, vol. 23, no. 1., H. I. Hanafi, R. H. Dennard, et al. "Design and Characterization of a CMOS Off-Chip Driver/Receiver with Reduced Power Supply Disturbance." May 1992, IEEE Journal of Solid-State Circuits, pp. 783–791, vol. 27, no. 5, M. Ishibe, S. Otaka, et al. "High-Speed CMOS I/O Buffer Circuits." April 1992, IEEE Journal of Solid-State Circuits, pp. 671–673, vol. 27, no. 4, T. Knight and A. Krymm. "Self Terminating Low Voltage Swing CMOS Output Driver." 1987 Proceedings of IEEE Custom Integrated Circuits Conference, pp. 289–292, M. S. J. Steyaert, W. Bijker, et al. "ECL-CMOS and CMOS-ECL Interface in 1.2-$\mu$m CMOS for 150-Mhz Digital ECL Data Transmission Systems." January 1991, IEEE Journal of Solid-State Circuits, pp. 18–24, vol. 26, no. 1 and H.-J. Schumacher, J. Dikken, and E. Seevinck. "CMOS Subnanosecond True-ECL Output Buffer." February 1990, IEEE Journal of Solid-State Circuits, pp. 150–154, vol. 25, no. 1., some CMOS systems today use low-swing signalling for inter-chip communications to save power and increase switching speed.

Examples of board-level CMOS designs include Gunning-threshold Logic (GTL) (as illustrated in B. Gunning, L. Yuan, et al. "A CMOS Low-Voltage-Swing Transmission-Line Transceiver." February 1992, Digest of Papers of IEEE International Solid-State Circuits Conference, pp. 58–59 and R. Foss, B. Prince, et al. "Fast interfaces for DRAMs." October 1992, IEEE Spectrum, pp. 54–57, vol. 29, no. 10.), RAMBUS (as illustrated in Rambus Corp. Rambus Architectural Overview. 1992, Rambus, Inc., Mountain View, Calif. and M. Farmwald and D. Mooring. "A fast path to one memory." October 1992, IEEE Spectrum, pp. 50–51, vol. 29, no. 10.; R. Foss, B. Prince, et al. "Fast interfaces for DRAMs." October 1992, IEEE Spectrum, pp. 54–57, vol. 29, no. 10), and RAMLINK (as illustrated in S. Gjessing, D. B. Gustavson, et al. "A RAM link for high speed." October 1992, IEEE Spectrum, pp. 52–53, vol. 29, no. 10 and R. Foss, B. Prince, et al. "Fast interfaces for DRAMs." October 1992, IEEE Spectrum, pp. 54–57, vol. 29, no. 10.).

Typically, the prior art does not use low-swing signalling within a single CMOS chip, because lowering the signal swing causes logic circuits to have a higher latency (i.e., the delay between the application of a signal to logic circuit inputs and the resulting effect on the output signals at the logic circuit outputs). A reduced output swing at a first gating level causes a next gating level to switch slower. Since circuit operational speed is a very important circuit parameter, minimization of latency is generally a primary circuit design parameter.

However, there are a few exceptional applications in which low-swing signalling is used. For example, low-swing signals are often used on the bit lines of RAM's. In Y. Nakagome, K. Itoh, et al. "Sub-1-V Swing Internal Bus Architecture for Future Low-Power ULSI's." April 1993, IEEE Journal of Solid-State Circuits, pp. 414–419, vol. 28, no. 4, low-swing signalling is proposed for use on internal buses within future ULSI chips. The time required to charge or discharge the relatively high capacitance of the bus is substantially lower due to the low voltage swing. The receiving circuitry in that application is slower and more complex than normal, because the signal swing is low, but these drawbacks are more than offset by the net reduction in signal transmission time.

In CMOS and many bi-CMOS mnicroprocessors, clock generation and distribution consumes a major portion of the total power. For example in the DEC Alpha microprocessor discussed in D. W. Dobberpuhl, R T. Witek, et al. "A 200-Mhz 64-b Dual-Issue CMOS Microprocessor." November 1992, IEEE Journal of Solid-State Circuits, pp. 1555–1568, vol. 27, no. 11. Brief summary published in February 1992, Digest of Papers of IEEE International Solid-State Circuits Conference, pp. 106–107, the clock generation and distribution circuitry dissipates 40% of the total input power. As indicated in D. W. Dobberpuhl, and in R. I. Bahar, D. Bernstein, et al. "A 100-Mhz Macropipelined VAX Microprocessor." November 1992, IEEE Journal of Solid State Circuits, pp. 1585–1598, vol. 27, no. 11, it is estimated that in recent CMOS and bi-CMOS microprocessor designs, between 15 and 40 percent of the total power is utilized by clock circuitry. Most of this power is dissipated by charging and discharging high-capacitance clock distribution lines at the chip's clock frequency.

As illustrated in the articles: R. Bechade, R. Flaker, B. Kauffmann, et al. "A 32b 66 Mhz 1.8 W Microprocessor." February 1994, Digest of Papers of IEEE International Solid-State Circuits Conference, pp. 208–209, D. Pham, M. Alexander, A. Arizpe, et al. "A 3.0 W 755PECint92 85SPEC; Superscalar RISC Microprocessor." February 1994, Digest of Papers of IEEE International Solid-State Circuits Conference, pp. 212–213; J. Schutz "A 3.3 V 0.6um BiCMOS Superscalar Microprocessor." February 1994, Digest of Papers of IEEE International Solid-State Circuits Conference, pp. 202–203; N. K. Yeung, Y.-H. Sutu, T. Su, et al. "The Design of a 55SPECint92 RISC Processor under 2 W" February 1994, Digest of Papers of IEEE International Solid-State Circuits Conference, pp. 206–207, and in U.S. Pat. No. 5,218,704, 4,316,247, 4,615,005, and 5,167,024 the global clock can be stopped or slowed when the circuit is idle, in order to reduce or eliminate the power consumption associated with such switching activity. As illustrated in the articles A Chandrakasan, A Burstein, and R. W. Brodersen. "A Low Power Chipset for Portable Multimedia Applications." February 1994, Digest of Papers of IEEE International Solid-State Circuits Conference, pp. 82–83; D. Pham, M. Alexander, A. Arizpe, et al. "A 3.0 W 75SPECint92 85SPEC Superscalar RISC Microprocessor." February 1994, Digest of Papers of IEEE International Solid-State Circuits Conference, pp. 212–213, J. Schutz, "A 3.3 V 0.6 um BiCMOS Superscalar Microprocessor." February 1994, Digest of Papers of IEEE International Solid-State Circuits Conference, pp. 202–203., and U.S. Pat. No. 4,615,005, clock signals to selected sections of the circuit are stopped when such sections are idle. This nearly eliminates the switching activity and power consumption of those sections and also reduces the power consumption of the clock driver circuitry.

U.S. Pat. No. 5,179,295 by Mattison et al presents an edge-triggered latch (flip/flop) design that triggers on both the rising and falling edges of the clock. Use of this flip/flop enables the clock frequency to be cut in half, thereby reducing clock power consumption. Unfortunately, the flip/flop design is relatively large.

In U.S. Pat. No. 5,160,859 entitled "Synchronous Internal Clock Distribution", issued to Dennis L. Wendell on Nov. 3, 1992 and its associated continuation U.S. Pat. No. 5,155,391, a method is presented of distributing a global clock signal at ECL voltage levels in a bi-CMOS chip. Typical ECL and CMOS swings in U.S. Pat. No. 5,155,391 are 1 V and 5 V, respectively. Local ECL-to-CMOS translator circuits convert the clock signal to CMOS levels for input to CMOS storage elements.

The purpose of the circuits presented in Wendell's two patents is to reduce delay and skew in distributing the clock signal, not to reduce power consumption. Indeed, the circuitry actually uses full-swing signals within each design style (CMOS and ECL) and does not use selective low-swing signals. Latches actually receive a full-swing CMOS clock signal that varies between 0 volts and 5 volts. Wendell's innovation is that the clock and latch circuitry is a mixture of ECL, CMOS, and voltage translator circuits.

U.S. Pat. No. 4,961,008, entitled *"Power Reduction Durng Power Down"* issued to Fujiwara et al on Oct. 2, 1990 presents a method for reducing power by shutting off one of two units in a digital circuit whenever possible. The unit which is always on is operated at a lower voltage than the second unit in order to save power. At least one low-voltage signal is transmitted from the always-on unit to the second unit. In the preferred embodiment, a level-converter circuit boosts the low-voltage signal(s) to a, level which the second unit can accept.

In an alternate embodiment, the second unit is able to receive the signals directly without any level conversion. In contrast to the design presented and claimed herein, the energy savings in their patent comes from powering down the second unit when possible and operating the first unit at low voltage. The authors do not indicate a preference between using a level converter circuit or having the second circuit receive the low-voltage signal(s) directly.

The clock circuit described in U.S. Pat. No. 4,961,008 differs significantly from the clock circuit presented herein. The preferred embodiment is a calculator-type device that includes a time-of-day clock as the first unit. The clock circuit is for keeping track of the time of day and not for providing clock cycles to digital circuits. If it were just a clock generator, it would be turned off whenever the calculator is not in use.

Reducing the voltage swing of clock signals in order to reduce power dissipation has been briefly suggested in one recent research paper T. G. Noll and E. De Man. "Pushing the Performance Limits due to Power Dissipation of Future ULSI Chips." May 1992, Proceedings of IEEE International Solid-State Circuits and Systems Conference (San Diego, Calif.), pp. 1652–1655, vol. 4. However, no circuit designs are shown. Also, the authors teach away from some of our designs. In particular, they state that it is only possible to lower the clock high (turn-on) voltage and is not possible to raise the clock low (turn-off) voltage in sub-micrometer CMOS circuits. Raising the clock low (turn-off) voltage would, in their opinion, create unacceptable leakage currents and loss of noise margin. In contrast, some of our methods do raise the clock low voltage. For example, the CMOS LPPT latch that we present uses both a lowered clock high voltage as well as a raised clock low voltage.

In the April 1994 paper by De Man and Schobinger entitled *Power Dissipation in the Clock Systeni of highly pipelined ULSI CMOS Circuits*, Proceedings of the 1994 IEEE International Workshop on Low Power Design, Napa Calif., pages 133–138, various types of clocking systems and storage elements are considered. The paper teaches away from using single-phase clocking and true single-phase registers as presented by Yuan and Svensson in the article "High-Speed CMOS Circuit Technique." February 1989, IEEE Journal of Solid-State Circuits, pp. 62–70, vol. 24, no. 1. De Man and Schobinger state that no significant overall power savings is achieved by using true single-phase registers. They also state that true single-phase registers make undesirable higher demands on the clock driver transition times, which elsewhere in the paper is shown to cause increased power consumption in the clock pre-drivers.

This paper also presents and recommends an approach of using low-voltage clocks in conjunction with transmission-gate latches in a complementary, non-overlapping clock system (page 137, right column). Each transmission-gate latch uses two clock signals (true and inverted clock). The complementary, non-overlapping clock system requires a total of four different clock signals (true and inverted of clock phases 1 and 2) (page 134, left column). Therefore, the only viable design which they present for using low-voltage swing clocking requires distribution of four clock signals in the system and use of latches which each require two clock signals.

In contrast, we present several latch designs which use only a single low-voltage clock signal. In addition, our methods enable the design of low-voltage clock systems which use only one or two or three clock signals rather than the minimum of four using De Man and Schobinger's method. Using fewer clock signals helps reduce the clock system's capacitance which reduces power consumption. Also, using fewer signals helps minimize undesired clock skew.

Also, one of our low-power latch designs (CMOS LPCI latch) is a modified version of a true single-phase latch developed by Yuan and Svensson. This latch is a relative of the true single-phase register which De Man and Schobinger recommend not to use. Both the true single-phase latch and the true single-phase register are described in the same paper by Yuan and Svensson.

We think there is potential for achieving significant power savings using our LPCI latch, despite De Man and Schobinger's comments about the true single-phase register. Among other advantages, our LPCI latch has no pre-charge dynamic logic, which is stated as a significant cause of power consumption for the true single-phase register (the 1994 De Man and Schobinger paper, on page 135).

In some cases, the designs presented herein might benefit from being combined with methods for shielding clock lines and methods for converting a DC supply voltage from one voltage to another. U.S. Pat. Nos. 4,514,749, 5,109,168, and 5,136,357 present a few methods of shielding clock lines which might be useful. U.S. Pat. Nos. 4,616,167, 5,189,316, and 5,194,762 describe some methods of converting a DC supply voltage to a lower DC voltage. Different, more efficient, or better methods for shielding clock lines or converting DC supply voltages may exist or be developed.

FIG. 1 illustrates the general, conceptual structure of a synchronous, digital circuit. This circuit consists of a clock generator 100 that supplies clock signals 102 to the clocked circuit(s) 104.

FIG. 2 illustrates the conventional method of clock signal distribution. A clock generator 200 generates clock signal(s) 202 that have the same voltage swing as normal logic signal(s) in the circuit. The clocked circuit(s) 204 use full-swing clock signal(s).

SUMMARY OF THE INVENTION

A method and associated circuit structures are presented that reduce the power consumption of digital circuits and digital sub-systems by selectively using low-swing signals in parts of the circuit. Methods and associated circuits are also presented that significantly improve the speed-power product of the chip by selectively utilizing low-swing signals whenever possible without degrading circuit functionality. Modified circuit structures are presented that function without significant loss of speed when low-swing signals are utilized. These circuits are able to operate with lower power consumption, because they are clocked by low-swing signals.

The power consumption of CMOS and bi-CMOS microprocessors and other chips can be substantially reduced by using low-voltage swing clocks. Savings of up to 60% to 80% of the normal clock power consumption are possible. If clock power consumption is between 20% and 40% of total power consumption, then the overall power savings is 12% to 32%.

CMOS, bi-CMOS and mixed CMOS/bipolar embodiments of circuits are presented that implement the selective use of low-swing clock signals to reduce power consumption without significantly degrading performance of circuits, but this invention is not limited to these classes of circuits. These reduced power consumption circuits are useful in many types of circuits, such as microprocessors and memories. This reduced power consumption reduces the cooling requirements for circuits, making it easier to prevent circuit heating that can degrade performance or even damage and/or reduce the useful life of such devices. Unlike some prior art devices that utilize low-swing clock signals only between chips, the intrachip circuits herein are adapted to be able to be clocked directly by low-swing clock signals without degrading circuit performance.

This invention utilizes low-swing signals to reduce the amount of power needed to charge and discharge clock lines, which is a major component of power dissipation in many circuits. Capacitive loading of clock lines is caused primarily by storage elements and dynamic (pre-charge) logic circuits. In most cases, storage elements introduce most of this capacitive load for the clock signals.

Circuit structures are presented that can be driven by low-swing signals without sacrificing speed. This contrasts with typical prior art devices that utilize low-swing signals, because the low-swing signals in such prior art are provided only on the lines connecting chips, and not on lines within these chips. Each chip includes receivers that convert these low-swing signals to full swing signals before distributing these signals to devices within each chip. Such prior art devices provide reduced power consumption on the inter-chip lines, but do not reduce power consumption within these chips, because these low-swing signals are boosted by this receiver before application to devices within such chip.

Because the reduction in the voltages of intrachip clock signals tends to reduce the speed of operation of circuits within a chip, new circuit designs are presented herein that substantially avoid such speed reduction. In accordance with this method, those clocked transistors (referred to herein as "speed-impacting transistors") are identified for which their transition speed and on-state conductivity significantly affect device operation. For example, in dynamic logic, a clocked transistor might be used in a path that precharges an output line. However, the speed of such dynamic logic is substantially independent of the speed of this transistor, but instead is dependent on the speed of a discharging transistor. Because the transitions in this transistor do not significantly affect logic operating speed, this is not a speed-impacting transistor and therefore need not be modified to increase its conductance. Therefore, in such circuits, it may only be necessary to increase the width of this discharging transistor to preserve operating speed. Some transistors that impact the speed of device operation, have such effect because they are clocked with a low-voltage clock signal. Such transistors will be referred to herein as "clocked, speed-impacting transistors".

In accordance with the disclosed invention, the on-state conductivity of those speed-impacting clocked and/or non-clocked transistors are improved sufficiently to significantly eliminate or reduce the impact of such transistors on circuit speed. This increased on-state conductivity can be achieved by widening such speed-impacting transistors or replacing such transistors by bipolar transistors.

These circuits each have an input for application of the voltage $V_{DD}$ as well as gate inputs for these low swing signals. A low-swing signal is defined to be a signal of amplitude less than $V_{DD}$. Such low-swing signals are generated to reduce power consumption, but it is also important to preserve the amplitude of signals that carry data. Therefore, structures are presented that pull the voltage on a storage node to $V_{DD}$ when a high state is to be stored on that node or that pull the voltage to ground when a low state is to be stored.

The use of such structures in our low-power, pass-transistor (LPPT) latches provides an additional benefit beyond restoring the amplitude to full-swing: High-speed latches can be designed using a single clocked transistor, in contrast to the conventional prior art of using two clocked transistors. This reduces the capacitive load on the clock line, which reduces power consumption.

The ability of these circuits to operate in response to low-swing signals, with no significant or only minor degradation of operating performance, such as operating speed, is achieved by: (i) increasing the width of speed-impacting clocked transistors; (ii) optionally increasing the width of some or all of a group of speed-impacting, non-clocked transistors; (iii) replacing speed-impacting transistors with bipolar transistors, which have lower on-state resistance and which are more sensitive to input voltage swings; and (iv) including structures that pull storage nodes to full-swing storage voltages even though the signals applied to the circuit are reduced-swing signals. Positive- and negative-transparent embodiments are presented for many of these circuit structures.

Positive- and negative transparent versions of low clock power, clocked-inverter (LPCI) latches are presented in which: just the pair of transistors, to which the ciock signal is applied, are widened; or, in addition to those two transistors, two serial, speed-impacting, non-clocked transistors that are connected to the voltage $V_{DD}$ or ground are also widened to offset the speed decrease caused by the reduction in the voltage of applied clock signals.

Operating speed can also be improved by use of a bipolar transistor for the clocked transistor of this latch. Because a bipolar transistor has a lower on-state resistance and higher sensitivity to input voltage swings than an MOS latch, this choice provides a speed improvement analogous to that was provided by using widened clocked transistors in the previously discussed MOS embodiments.

The speed of dynamic logic is also improved by reducing the on-state resistivity of some or all of the clocked transistors and/or transistors that are connected in series or parallel between the storage node and either $V_{DD}$ or ground. This can also be achieved by widening one or more CMOS transistors and/or by replacing one or more of such CMOS transistors with bipolar transistors.

To maximize the benefit of using low-swing clocks, the supply voltages for the clock drivers must be generated efficiently. One efficient method is presented herein. This method uses two clocking networks, such as clocking networks for positive and negative-transparent CMOS LPCI latches, as cascaded charge pumps. The design first transfers charge from $V_{DD}$ to an intermediate supply voltage rail $V_X$ through one clocking network and then transfers the charge from $V_X$ to ground through a second clocking network. This automatically helps generate the supply voltage $V_X$ efficiently with minimum additional power consumption and with low circuit complexity. A large capacitor and an optional secondary power supply are used to stabilize $V_X$ within a small voltage range.

DESCRIPTION OF THE PREFERRED EMBODIMENTS

Low-Power Clock Distribution

Figure 1:
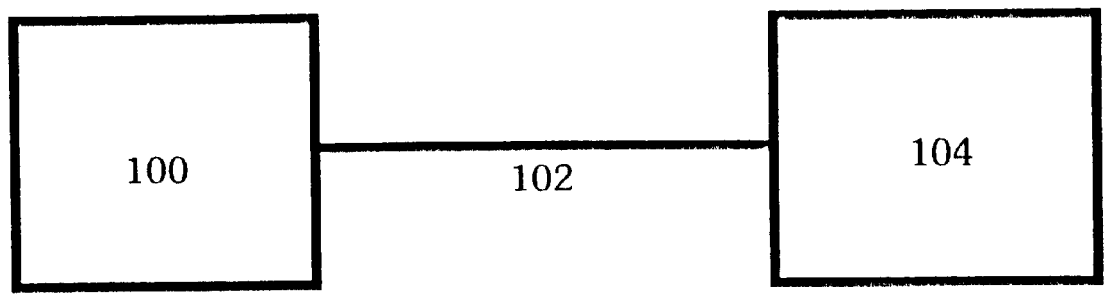
FIG. 1 illustrates a prior art synchronous circuit that includes a clock generator and a clocked circuit.
Figure 2:
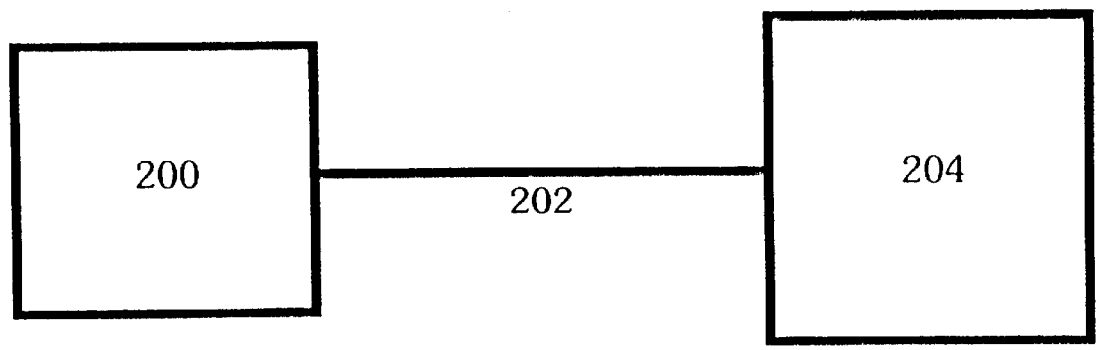
FIG. 2 illustrates a prior art synchronous circuit that uses full-swing clock signals.
Figure 3:
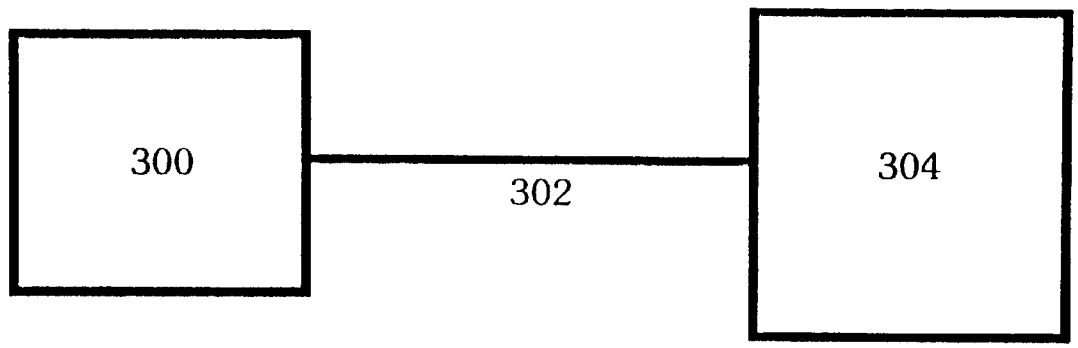
FIG. 3 illustrates the general structure of a synchronous circuit that uses low-swing clock signals.

FIG. 3 illustrates the general structure of a synchronous circuit that uses low-swing clock signals. A clock generator 300 creates low-swing clock signal(s) 302 that have a lower voltage swing than is conventionally utilized in the digital circuit design class (e.g., CMOS, bi-CMOS, etc.) of a set of clocked circuits 304 to which these signals 302 are applied. The clocked circuit(s) 304 are designed to operate in response to such low-swing clock signals.

Figure 4:
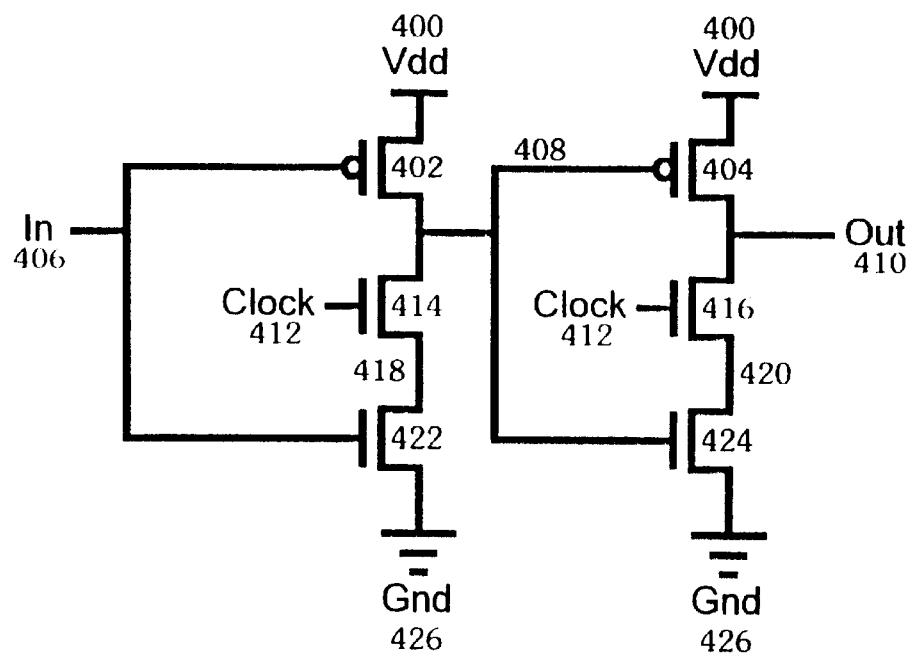
FIG. 4 illustrates a prior-art CMOS positive-transparent latch design proposed by Yuan and Svensson.

FIG. 4 shows a prior-art latch first described in the article by Yuan and Svensson J. Yuan and C. Svensson. "High-Speed CMOS Circuit Technique." February 1989, IEEE Journal of Solid-State Circuits, pp. 62–70, vol. 24, no. 1. and in the article by J. Yuan and C. Svensson "Pushing the limits of standard CMOS." February 1991, IEEE Spectrum, pp. 52–53. The functionality of that latch is illustrated in the discussion of the latch presented in FIG. 5 and therefore such discussion is not repeated for FIG. 4. To facilitate the application of the teaching in regarding the device in FIG. 5 to the device in FIG. 4, the reference numbers used in those two cases generally differ only in a first digit of each reference numeral.

Figure 5:
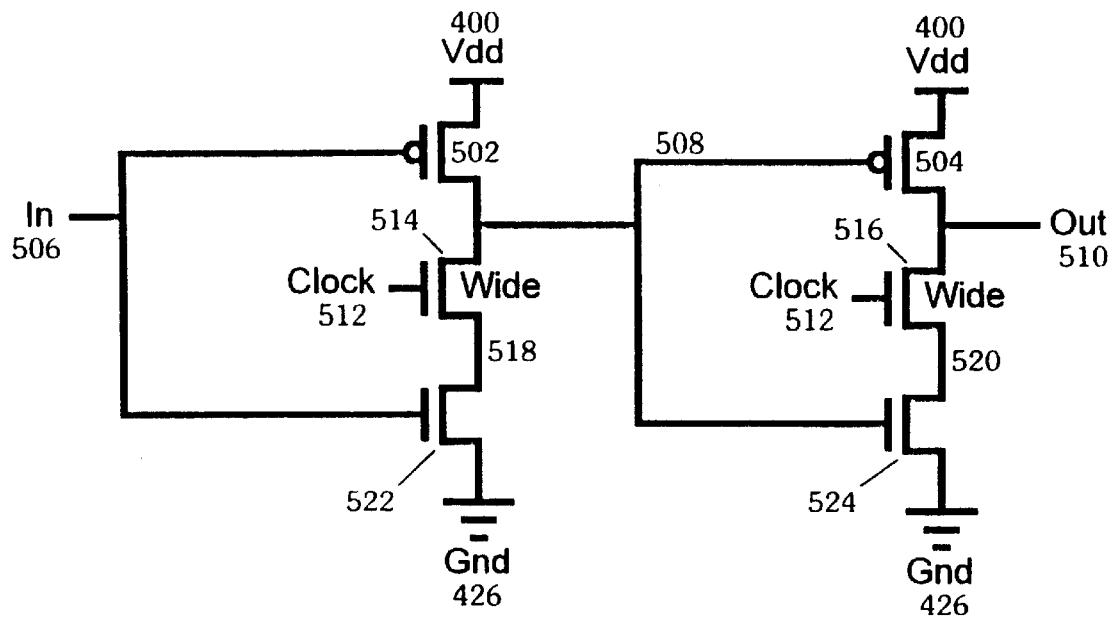
FIG. 5 illustrates a CMOS, low clock-power, clocked-inverter (LPCI) transparent latch that can be clocked using a low-swing clock signal and that is positive-transparent (i.e. transparent when the clock signal is high).

FIG. 5 shows a low clock-power, clocked-inverter (LPCI) latch, which is derived by modifying the latch shown in FIG. 4 to utilize low-swing clock signals. Since the clock signal 512 has, a low voltage swing, transistors 514 and 516 are made wider to compensate. Transistors 522 and 524 can also be made wider.

Transistors 502, 514, and 522 form what we denote as a clocked inverter with a sianal In applied to an input 506 to produce and output signal Out on an output 510. When Clock 512 is a logic high, the clocked inverter operates like a standard inverter. When Clock 512 is a logic low, the discharge path to GND 426 is blocked, so node 508 cannot be discharged.

Transistors 504, 516, and 524 also form a clocked inverter. The LPCI latch shown in FIG. 5 consists therefore a pair of clocked inverters connected in series.

Operation of Positive-transparent LPCI Latch

When Clock 512 is low, it is not possible for a transition in the input signal In applied to input 506 to cause a transition in the output signal Out produced on output 510 due to the following:
- node 508 cannot be discharged from a high to low voltage, because transistor 514 is non-conducting;
- similarly, the output signal Out produced on output 510 cannot be discharged from a high voltage to low voltage, because transistor 516 is non-conducting;
- because node 508 is not allowed to go from a high to low voltage, it is not possible to cause transistor 504 to go from a non-conducting to a conducting state. Therefore, the output signal Out produced on output 510 cannot be charged from a low to high voltage;
- because the output signal Out produced on output 510 can neither be charged nor discharged, it is not possible for a transition in the input signal In produced on input 506 to cause a transition in the output signal Out when Clock 512 is low.

Therefore, the output signal Out produced on output 510 is a dynamic storage node when Clock 512 is low. While Clock 512 is high, signal Out is driven by input signal In via two inverters in series. Therefore, the LPCI latch is a non-inverting, positive-transparent, dynamic latch.

Clock 512 is a low voltage-swing signal. The voltage swing on Clock 512 is said to function logically, if the voltage of logic low stops conduction and the voltage of logic high allows conduction. In practice, the low voltage is usually zero (GND) or near zero volts, and the high voltage is chosen to make transistors 514 and 516 reasonably conductive for speed reasons.

The fact that transistors 514 and 516 are wider than normal helps compensate for the reduced voltage swing. Because the transistors are wider, the propagation delay from the transition of the clock signal to the output is only slightly longer than the delay of the regular Yuan-Svensson latch (which uses a full-swing clock signal).

When two MOS transistors are connected in series and one transistor receives a low-voltage signal at its gate, it can be beneficial to re-size both transistors. For example, this situation occurs for transistors 514 and 522 shown in FIG. 5. Suppose the effective resistance of each transistor would be R if the applied gate voltages were full voltage swing. The original effective resistance of the transistor pair would be 2*R. Suppose that the application of the low-voltage clock signal 512 to transistor 514 makes transistor 514 have an effective resistance of 4*R instead.

To increase the speed, the effective resistance of the series pair 514 and 522 must be reduced. One way would be to make transistor 514 very wide (e.g. 2.666 times minimum) but leave transistor 522 minimum-sized. For example, if transistor 514 were made 2.666 times wider, the net effective resistance of the two transistors in series would be 2.5*R. However, that increases the capacitance on the clock line 512 by multiplying the gate capacitance by 2.666. This adversely affects the clock power consumption.

For some designs, a possibly better way is to make transistor 514 wider (e.g. 2 times minimum) but also make transistor 522 wider (e.g. 2 times minimum). This increases the capacitance on the clock line 512 by a smaller amount at the expense of increased capacitive load on the input 506. For example, if each transistor were sized up by 2 times, then the net effective resistance Mould be 2.5*R, while only increasing the capacitance on the clock signal 512 by multiplying the gate capacitance by 2. This may be a useful trade-off for reducing the overall power consumption.

This LPCI latch is suitable for driving small loads. Large loads should be driven using a buffer following the latch. This is also true for the regular Yuan-Svensson latch but to a lesser degree.

The use of a low-swing clock signal (for example from 0 V to 2.7 V instead of 0 V to 5 V), sharply decreases the power consumption caused by charging and discharging the clock distribution line using a high-frequency clock signal. The capacitance on the clock line is increased by the widening of transistors 514 and 516, but the effect of this in increasing power consumption is more than offset by the decrease in signal swing.

The optimal voltage swings, transistor sizes, and other parameters are dependent upon the particular design and fabrication technology.

Figure 6:
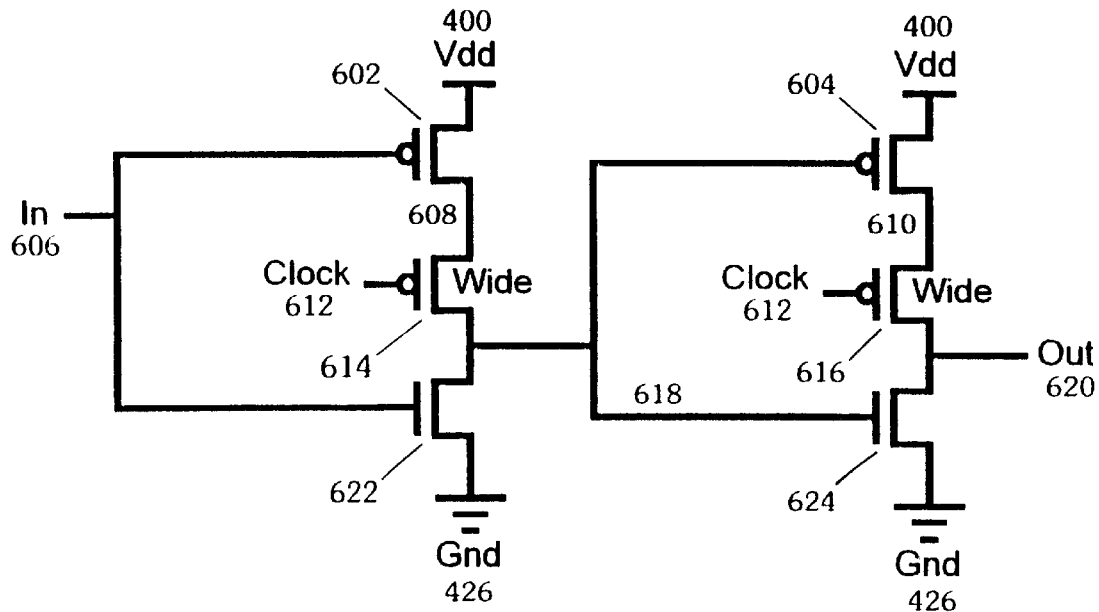
FIG. 6 illustrates a negative-transparent version of the CMOS LPCI latch that can be clocked using a low-swing clock signal.

FIG. 6 shows a negative-transparent version of the LPCI latch. The operation of this latch is similar to the latch presented in FIG. 4 except that this latch is transparent (i.e., passes the input signal In to output 620) when the clock signal on clock input 612 is low and is closed (i.e., does not pass signal In) when the clock signal 612 is high. Transistors 602, 614, and 622 form a clocked inverter, and transistors 604, 616, and 624 form another clocked inverter.

Operation of the Negative-transparent LPCI Latch

When Clock 612 is high, it is not possible for a transition on In 606 to cause a transition at Out 620 due to the following:
- because transistor 614 is non-conducting, node 618 cannot be charged from a low to high voltage;
- because transistor 616 is non-conducting, output 620 cannot be charged from a low to high voltage;
- becaase node 618 is not allowed to go from a low to high voltage, it is not possible to cause transistor 624 to go from a non-conducting to conducting state—therefore, Out 620 cannot be discharged from a high to low voltage; and
- because Out 620 can neither be charged nor discharged, it is not possible for a transition on In 606 to cause a transition in signal Out produced at output 620 when Clock 612 is high. Therefore, output 620 is a dynamic storage node when Clock 612 is high.

When Clock 612 is low, Out 620 is driven by In 606 via two inverters in series. Therefore, the negative-transparent LPCI latch is a non-inverting, negative-transparent, dynamic latch.

The clock signal applied to clock input 612 is again a low voltage-swing signal. The voltage swing on Clock 612 works logically if the voltage of logic high stops conduction and the voltage of logic low allows conduction. In practice, the high voltage is usually at or near $V_{DD}$ volts, and the low voltage is chosen to make transistors 614 and 616 reasonably conductive for speed reasons.

The use of transistors 614 and 616 that are wider than normal helps compensate for the reduced voltage swing. Because the transistors are wider, the propagation delay from the transition of the clock signal to the output is only slightly longer than the delay of the regular Yuan-Svensson latch (using a full-swing clock signal). This LPCI latch is therefore suitable for driving small loads. Large loads can be driven by including a buffer at the output 620 of the latch. (This is also true for the regular Yuan-Svensson latch but to a lesser degree.)

Transistors 602 and 604 can also optionally be made wider for increased speed.

The use of a low-swing clock signal (for example, that swings between 2.3 V and 5.0 V instead of between 0 V to 5 V) sharply decreases the power consumption caused by charging and discharging the clock distribution line using a high-freqtency clock signal. Although the capacitance on the clock line has been increased by the widening of the transistors, this is more than compensated for by the decrease in signal swing. The optimal voltage swings, transistor sizes, and other parameters are dependent upon the particular design and fabrication technology.

Figure 7:
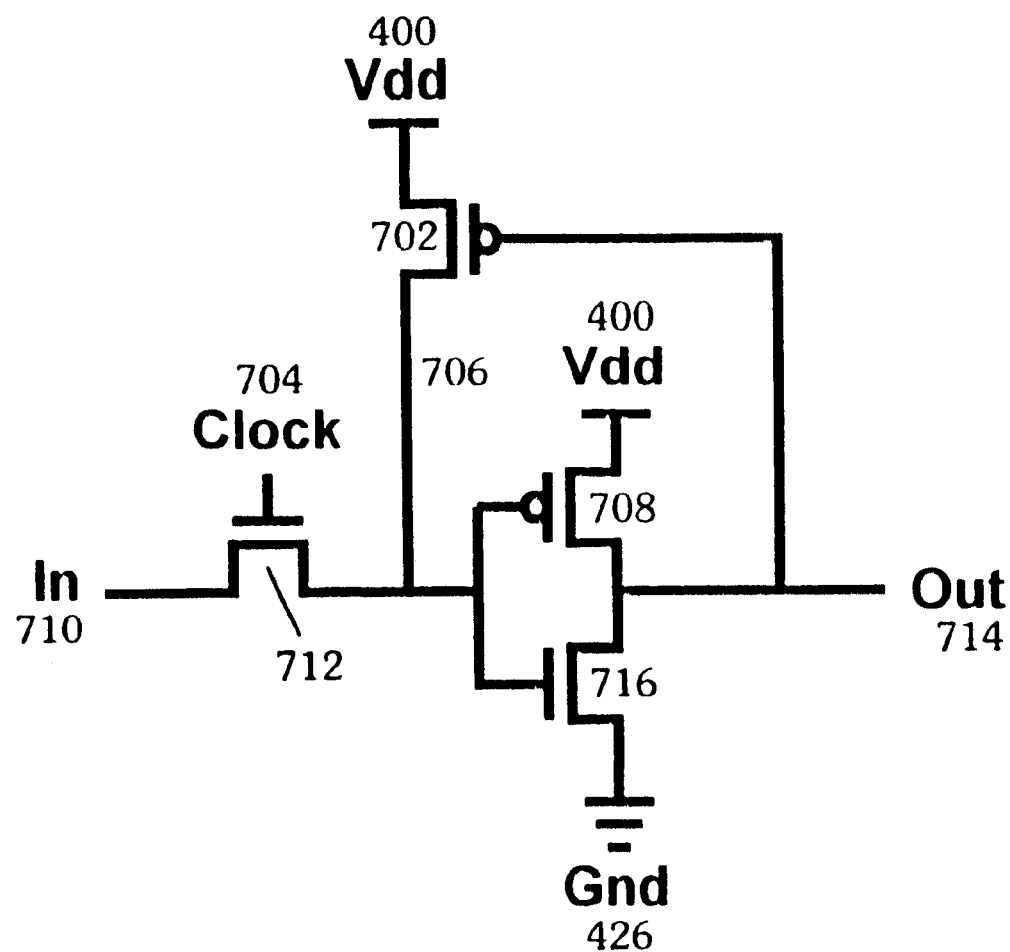
FIG. 7 illustrates a CMOS, low clock-power, pass-transistor (LPPT) positive-transparent latch that can be clocked using a low-swing clock signal.
Figure 8:
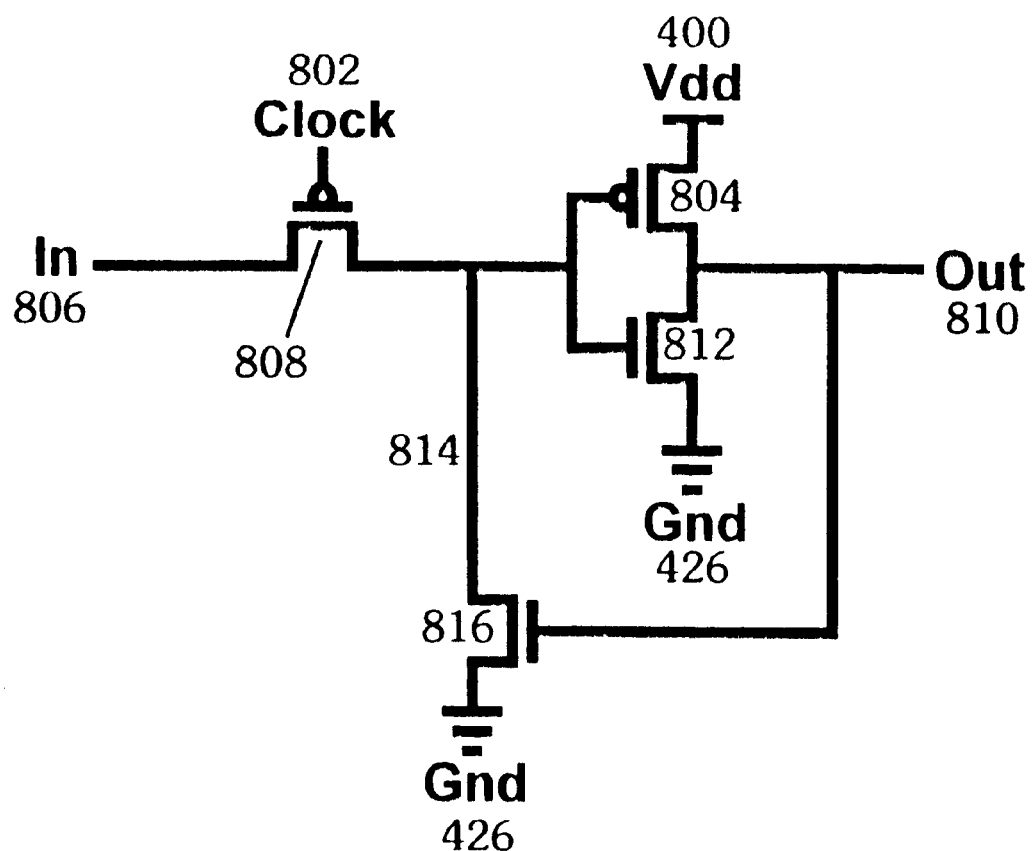
FIG. 8 illustrates a negative-transparent version of the LPPT latch that can be clocked using a low-swing clock signal.

FIGS. 7 and 8 illustrate another type of latch structure that implements low-swing clock signalling. The embodiment in FIG. 7 is a positive-transparent, low-clock power, pass-transistor (LPPT) latch and the embodiment in FIG. 8 is a negative-transparent, low-clock power, pass-transistor (LPPT) latch.

In the embodiment in FIG. 7, transistors 708, 712, and 716 form a 3-transistor dynamic latch consisting of a pass transistor 712 and an inverter formed by transistors 708 and 716. Transistor 702 (referred to herein as a "pullup transistor") provides feedback to pull up storage node 706 substantially to $V_{DD}$ when signal Out produced at output 714 is low. Pull-up transistor 702 ensures that, although a clock signal applied to clock input 704 does not reach the voltage $V_{DD}$, the storage node can still reach $V_{DD}$. This pull-up transistor 702 is designed to be less conductive than transistor 712 (e.g., by sizing the transistors 702 and 712), so that clocked transistor 712 can always override the value currently stored.

Our simulations show that transistor 712 need not necessarily be made wider than minimum width for high-speed. The qualitative reasons are as follows:
  a logic 0 from the input signal In connected to 710 is quickly conducted into the storage node 706 because transistor 712, being NMOS, is a low-impedance conductor of logic 0. The reduction in clock voltage swing is not sufficient to affect this enough to slow down the latch (i.e. the conduction of a logic 1 is at least as slow);
  a logic 1 from the input signal In connected to 710 is quickly conducted into the storage node 706 with help from the pull-up transistor 702.

In fact, even with low-voltage clocking, this latch is shown in our sample simulations to be faster than the CMOS LPCI latch using low-voltage clocking and also faster than a standard 3-transistor pass-gate latch which uses a full-voltage clock.

It helps to utilize a ratio of the gate widths of the NMOS and PMOS transistors 708 and 716 in the inverter such that a plot of its DC input voltage versus DC output voltage exhibits a DC output voltage of $0.5*V_{DD}$ at an input voltage slightly lower than $0.5*V_{DD}$. When input signal In applied to input 710 rises while Clock 704 is high, this ratio of gate widths causes the signal Out produced at output 714 to fall sooner, thereby turning on the secondary pull-up transistor 702 sooner to pull the storage node 706 to $V_{DD}$. Because this causes some reduction in noise margin on the input signal In on input 710, the choices of parameters are selected to balance the effect of this reduced noise margin against improved speed.

Unlike the low-voltage transmission gate latch presented in the 1994 De Man and Schobinger paper and the CMOS LPCI latch presented herein, the CMOS LPPT latch requires only one transistor to be clocked, instead of two, thereby reducing the capacitance on the clock line, which therefore reduces power consumption.

Operation of Positive-transparent LPPT Latch

Clock 704 has a voltage swing from about $GND+V_{THN}$ to $V_{HIGH2}$ where:
  $V_{THN}$ is the NMOS transistor threshold voltage, in the chosen process technology; and
  $V_{HIGH2}$ is the peak voltage of the Clock signal and is selected to be somewhat lower than $V_{DD}$, but still high enough that, when the input signal In applied to input 710 is high and Clock 704 is at $V_{HIGH2}$, node 706 rises enough to make the output signal Out at output 714 begin to drop. This causes transistor 702 to conduct which pulls node 706 to $V_{DD}$. In one simulated configuration, $V_{HIGH2}$ is selected to be substantially equal to $V_{DD}-V_{THN}$.

When the Clock signal applied to gate 704 of transistor 712 is at $GND+V_{THN}$, transistor 712 is essentially non-conducting (i.e. it can only conduct small sub-threshold currents), whereby node 706 acts as a storage node. If node 706 is high and input signal In produced at input 710 is low, then a tiny current can flow through transistor 712. However, when transistor 702 is conducting, node 706 remains at $V_{DD}$. If input signal In applied to input 710 is high and node 706 is low, then a tiny current can flow through transistor 712. However, node 706 will not rise above $GND+V_{THN}$. Therefore, node 706 can store logic values dynamically.

When Clock 704 is at $V_{HIGH2}$, transistor 712 is conducting. If the input signal In applied to input 710 is high and node 706 is low, then node 706 will rise toward $V_{HIGH2}-V_{THN}$. This causes the output signal Out produced at output 714 to fall, thereby turning on transistor 702. This pulls node 706 to $V_{DD}$. If the input signal In applied to input 710 is low and node 706 is high, then node 706 will fall to GND. Transistor 702 has dimensions selected to make it weaker than transistor 712, so that node 706 will fall even though transistor 702 conducts until signal Out produced at output 714 rises.

The optimal voltage swings, transistor sizes, and other parameters are dependent upon the particular design and fabrication technology.

FIG. 8 presents a negative-transparent version of the LPPT latch presented in FIG. 7. Transistors 804, 808, and 812 form a 3-transistor dynamic latch consisting of an inverter formed by transistors 804 and 812 and a pass transistor 808. Transistor 816 provides feedback to pull down node 814 to a lower voltage when the output signal Out produced on output 810 is high. Pullup transistor 702 and pulldown transistor 816 provide analogous functionality and therefore will be referred to generically herein as a "pullup/pulldown transistor".

The inclusion of extra pull-down transistor 816 ensures that, although the Clock signal applied to gate 802 does not reach the voltage GND, the storage node can still reach GND. This pull-down transistor 816 is made weaker than transistor 808 (e.g. by transistor sizing) so that the clocked transistor 808 always can override the value currently stored.

Our simulations show that transistor 802 need not necessarily be made wider than minimum width for high-speed. The qualitative reasons are as follows:

- a logic 1 from the input signal In connected to 806 is quickly conducted into the storage node 814 because transistor 808, being PMOS, is a low-impedance conductor of logic 1. The reduction in clock voltage swing is not sufficient to affect this enough to slow down the latch (i.e. the conduction of a logic 0 is at least as slow); and
- a logic 0 from the input signal In connected to 806 is quickly conducted into the storage node 814 with help from the pull-down transistor 816.

In fact, even with low-voltage clocking, an LPPT latch is shown in our sample simulations to be faster than the CMOS LPCI latch using low-voltage clocking and also faster than a standard 3-transistor pass-gate latch which uses a full-voltage clock.

It helps to utilize a ratio of the gate widths of the NMOS and PMOS transistors 804 and 812 in the inverter such that a plot of its DC input voltage versus DC output voltage exhibits a DC output voltage of $0.5*V_{DD}$ at an input voltage slightly higher than $0.5*V_{DD}$. When input signal In applied to input 806 falls while Clock 806 is low, this ratio of gate widths causes the signal Out produced at output 810 to rise sooner, thereby turning on the secondary pull-up transistor 816 sooner to pull the storage node 814 to GND. Because this causes some reduction in noise margin on the input signal In on input 806, the choices of parameters are selected to balance the effect of this reduced noise margin against improved speed.

Unlike the low-voltage transmission gate latch presented in the 1994 De Man and Schobinger paper and the CMOS LPCI latch presented herein, the CMOS LPPT latch requires only one transistor to be clocked, instead of two, thereby reducing the capacitance on the clock line, which therefore reduces power consumption.

Operation of Negative-transparent LPPT Latch

The Clock signal applied to gate 802 has a voltage swing from about $V_{LOW2}$ to $V_{DD}-V_{THP}$ where: $V_{THP}$ is the absolute value of the PMOS transistor threshold voltage in the chosen process technology (using this absolute value convention, $V_{THP}$ is positive and $V_{DD}-V_{THP<VDD}$); and $V_{LOW2}$ is chosen to be somewhat higher than GND, but is low enough that when Clock 802 is at $V_{LOW2}$ and signal In applied to input 806 is at GND, then the voltage on node 814 drops enough that signal Out produced on output 810 rises. This then causes transistor 816 to conduct which pulls node 814 to GND. In one example simulation, $V_{LOW2}$ was chosen to be $V_{THP}$.

When the Clock signal applied to transistor gate 802 is at $V_{DD}-V_{THP}$, transistor 808 is essentially non-conducting (i.e. it can only conduct small sub-threshold currents). Node 814 functions as a storage node. If the voltage on storage node 814 is low and the input signal In on input 806 is high, then a tiny current can flow through transistor 808. However, transistor 816 is conducting, so that node 814 remains at GND. When the input signal In on input 806 is low and the voltage on storage node 814 is high, then a tiny current can flow through transistor 808. However, the voltage on node 814 will not fall below $V_{DD}-V_{THP}$. Therefore, node 814 can store logic values dynamically.

When the Clock on gate 802 is at $V_{LOW2}$, transistor 808 is conducting. If the input signal In on input 806 is low and the voltage on node 814 is high, then the voltage on node 814 will fall toward $V_{LOW2}+V_{THP}$ This causes the output signal Out produced at output 810 to rise, which turns on transistor 816. This pulls the voltage on node 814 to GND. If signal In applied to input 806 is high and the voltage on node 814 is low, then the voltage on node 814 will rise to $V_{DD}$. Transistor 816 is selected to be sufficiently weaker than transistor 808, that the voltage on node 814 will rise even though transistor 816 conducts until the signal Out produced on output 810 falls. The optimal voltage swings, transistor sizes, and other parameters are dependent upon the particular design and fabrication technology.

Figure 9:
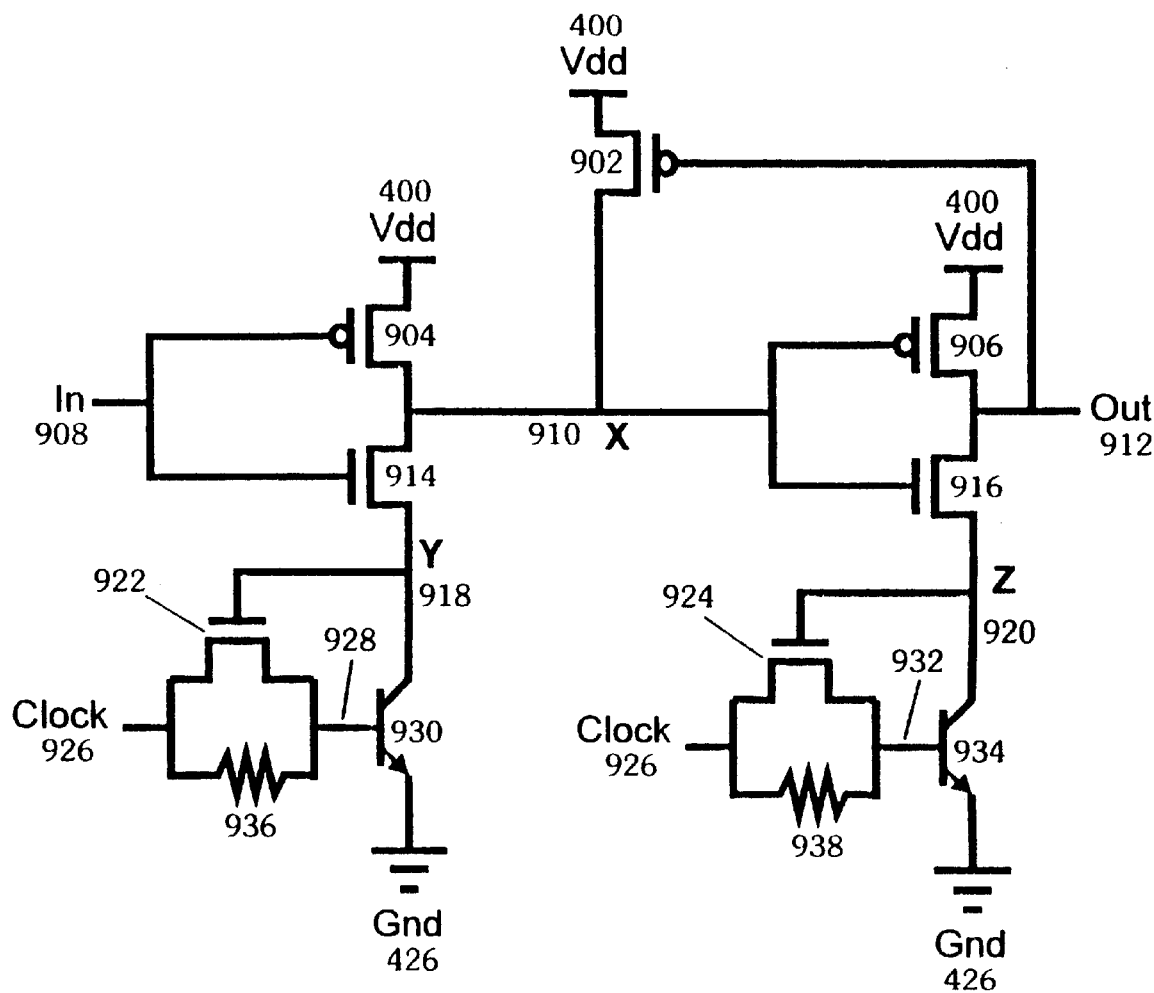
FIG. 9 illustrates a bi-CMOS, low clock-power, clocked-inverter (LPCI) transparent latch that can be clocked using a low-swing clock signal and that is positive-transparent.

FIG. 9 presents a bi-CMOS LPCI latch that implements low-swing clock signalling. This latch is similar to the LPCI latch shown in FIG. 5, in that transistors 904, 914, and 930 form a clocked inverter. Transistor 922 and resistor 936 serve to regulate the current drawn by the bipolar transistor 930. Similarly, transistors 906, 916, and 934 form a clocked inverter, and transistor 924 and resistor 938 serve to regulate the current to bipolar transistor 934. The latch in FIG. 9 is therefore composed of two clocked inverters connected in series. Transistor 902 is used as a pull-up to pull node 910 to a full high voltage.

Operation of bi-CMOS LPCI Latch

When the Clock signal on clock input 926 is low, it is not possible for a transition on signal In produced on input 908 to cause a transition in the output signal Out produced on output 912. This can be seen as follows.

Node 910 cannot be discharged from a high to low voltage because transistor 930 is non-conducting. Similarly, the output signal Out produced on output 912 cannot be discharged from a high to low voltage because transistor 934 is non-conducting.

Because node 910 is not allowed to switch from a high to a low voltage, it is not possible for transistor 906 to change from a non-conducting to a conducting state. Therefore, the output signal produced on output 912 cannot be charged from a low to high voltage.

Since the output signal Out produced on output 912 can neither be charged nor discharged, it is not possible for a transition in input signal In applied to input 908 to cause a transition in the output signal Out produced at output 912 when the Clock signal applied to clock input 926 is low. Therefore, output 912 is a dynamic storage node when the Clock signal applied to clock input 926 is low.

When this Clock signal is high, the output signal Out is driven by the input signal via input 908 and a pair of inverters (904, 914; and 906, 916) connected in series. Therefore, this bi-CMOS LPCI latch is a non-inverting, positive-transparent, dynamic latch.

The Clock signal applied to clock input 926 is a low voltage-swing signal. The voltage swing on Clock 926 is selected such that the voltage of logic low stops conduction and the voltage of logic high enables conduction. In practice, the low voltage is generally zero (GND) or near zero volts and the high voltage is chosen to cause a reasonable amount of current to flow through from Clock 926 into the bases of NPN transistors 930 and 934, which in turn causes NPN transistors 930 and 934 to be conductive. For example, Clock 926 can be selected to swing between a high voltage of 1.2 V and a low voltage of 0 V.

When the Clock signal on clock input 926 is high and the voltage on node 918 is below the voltage of node 928, then NPN transistor 930 is in saturation. Similarly, when the voltage of node 920 is below the voltage of node 932, then NPN transistor 934 is in saturation. If the Clock signal applied to clock input 926 were applied directly to the bases of NPN transistors 930 and 934, a large amount of current would be drawn from Clock 926 whenever transistor 930 or 934 saturates. Resistors 936 and 938 are included to limit the current drawn from Clock 926. However, the use of these resistors alone would tend to slow down the design if the resistor values are high enough to make the worst-case saturation current flow small.

To keep the operating speed fast, NMOS transistors 922 and 924 are included. When Clock 926 is high and the voltage on node 918 is one threshold $V_{THN}$ or more above the voltage on node 928, then NMOS transistor 922 conducts additional current from clock input 926 to the base of NPN transistor 930. This increases the speed of the circuit by increasing the current flowing from node 918 to GND. However, transistor 922 does not cause additional current to be drawn through clock input 926 when NPN transistor 930 saturates, because transistor 922 stops conducting when the voltage on node 918 drops. NMOS transistor 924 functions in a similar way for the second clocked inverter.

This circuit experiences a charge sharing effect that must be controlled. When the Clock signal applied to clock input 926 is low, the input signal In applied to input 908 can transition between low and high. This produces a sharing of charge between nodes 910 and 918, which reduces a high output on node 910 to less than a normal high. This effect can also occur in the second half of the circuit, where the output signal Out produced on output 912 can drop below a normal high because of charge sharing between output 912 and node 920.

To control this sharing, the relative capacitances involved must be selected appropriately. PMOS transistor 902 is included to keep the intermediate node 910 at a high level. When charge sharing occurs on node 910, this node is restored to a high level by transistor 902 since the output signal Out at output 912 will always be low when node 910 is high before the end of the last transparent period of the Clock signal on clock input 926. Transistor 902 is dimensioned to be weak, so that it can be over-ridden.

To decrease the propagation time from the application of a rising edge in the Clock signal applied to clock input 926 and the resulting transition in the output signal Out produced on output 912, the rate of charging of the bases of the bipolar transistors 930 and 934 can be increased. However, the following trade-offs occur.

A. Sourcing the bipolar transistor bases through lower resistance resistors 936 and 938 will turn on the bipolar transistors 930 and 934 faster, thus decreasing the propagation time from Clock 926 rising to Out 912. However, static power consumption will increase.

B. Using wider NMOS transistors 922 and 924 between Clock 926 and the bipolar transistors 930 and 934 will also reduce the propagation delay, but increases the effect of charge sharing.

C. Using only resistors 936 and 938 and eliminating NMOS transistors 922 and 924 between Clock 926 and the bipolar transistors 930 and 934 will reduce the charge sharing effect on both node 910 and output 912. However, this increases the propagation delay from a rising edge in Clock 926 to a resulting transition in the output signal Out produced on output 912.

The use of a low-swing clock signal, for example from 0 V to 1.2 V instead of 0 V to 5 V, sharply decreases the power consumption caused by charging and discharging the clock distribution line using a high-frequency clock signal. The capacitance on the clock line has actually been increased compared to the original Yuan-Svensson latch shown in FIG. 4, but this is more than compensated for by the decrease in signal swing. The optimal voltage swings, transistor sizes, resistor values, and other parameters are dependent upon the particular design and fabrication technology.

A negative-transparent version of this bi-CMOS LPCI latch is possible if PNP bipolar transistors are available. The design would be similar to the negative-transparent version of the CMOS LPCI latch.

Low-swing Clock Signalling with Dynamic Logic Structures

Figure 10:
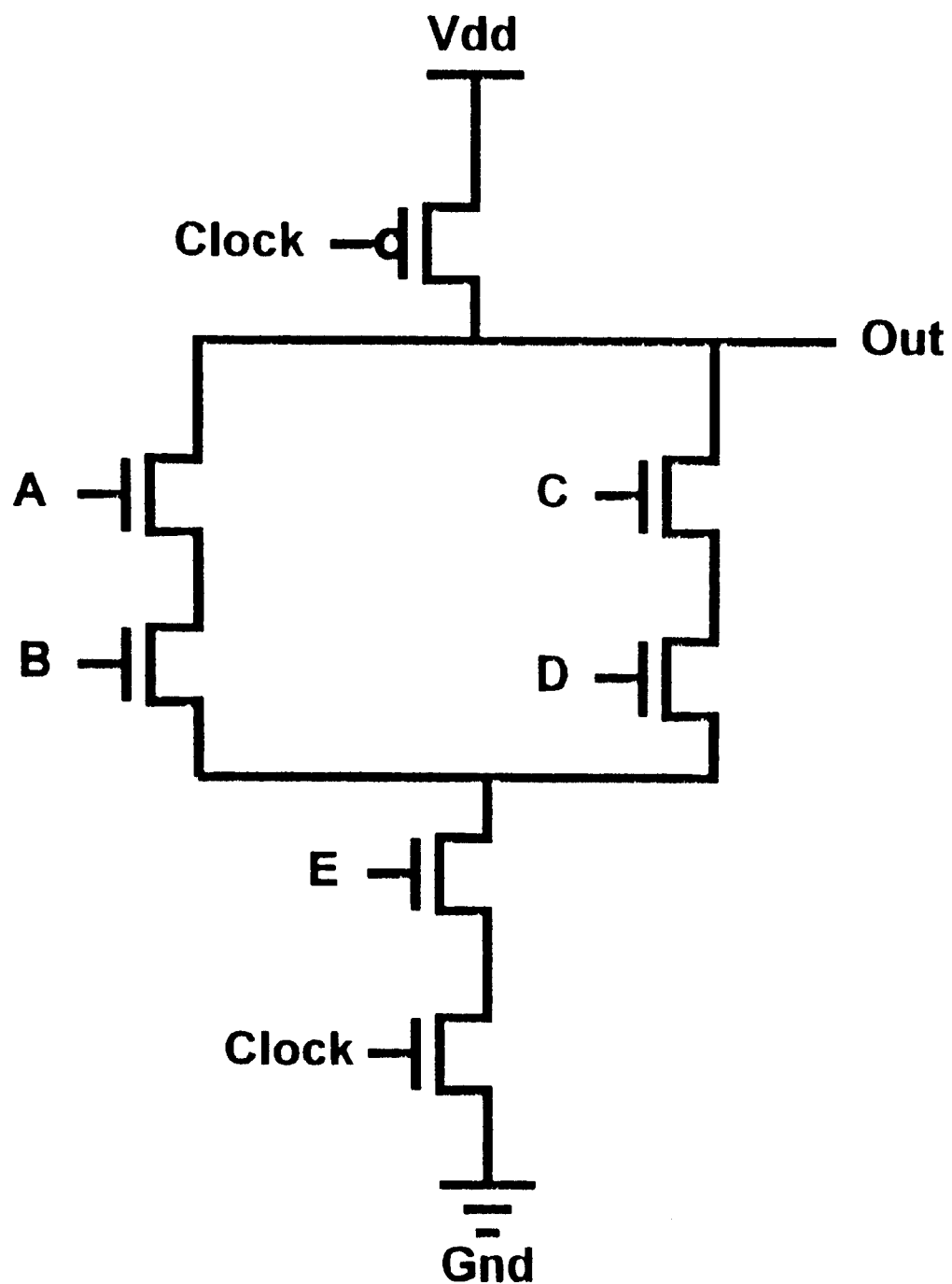
FIG. 10 illustrates a prior-art, standard CMOS dynamic logic gate.
Figure 11:
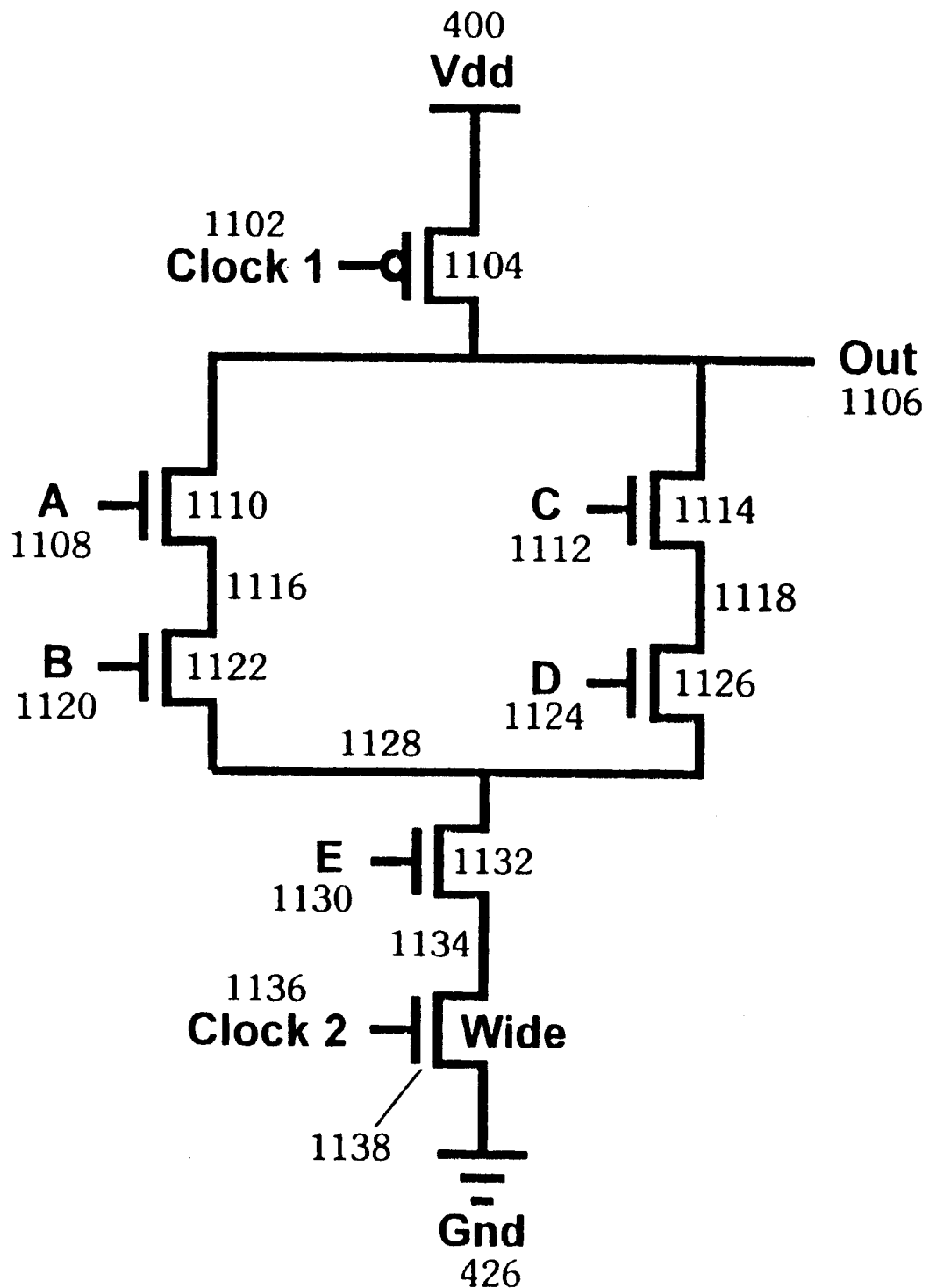
FIG. 11 illustrates a CMOS dynamic logic gate that can be clocked using a low-swing clock signal.

FIG. 11 presents one example of the use of low-swing clock signals in dynamic logic gates. As gate designs vary depending on the logic function implemented, the gate shown is merely an example. The gate shown in FIG. 11 is a modification of the conventional CMOS dynamic logic gate shown in FIG. 10. Transistor 1104 is used to precharge the output signal Out, produced on output 1106, to a logic high based on Clock 1.

Transistors 1110, 1114, 1122, 1126 and 1132 are used to evaluate the logic function. In this particular logic gate, the logic function is:

$$\text{Out}=((A^*B+C^*D)^*E)' \qquad \text{(i)}$$

Transistor 1138 controls when the logic function is evaluated based on the clock signal Clock 2 applied to clock input 1136. To reduce the propagation time from the logic inputs to the production of the output signal Out at output 1106, transistor 1138 is made wider (preferably 25% wider or more) than the transistor in FIG. 10 to compensate for the low-voltage swing of Clock 2.

Various methods have been developed previously for handling charge-sharing problems in dynamic logic gates. The same methods can be applied both to the standard CMOS dynamic logic scheme and our novel dynamic logic scheme. As these methods are not part of the current innovation and are the same for both the standard gate and our novel gate, we do not describe them here.

Operation of a Low Clock Swing CMOS Dynamic Logic Gate

The Clock 1 signal applied to clock input 1102 and the Clock 2 signal applied to clock input 1136 form a two-phase clocking system that is generally non-overlapping. The alignment of the clocks is usually much less critical for this type of dynamic logic than for the storage elements in a design. Clock 1 is active-low (i.e. active when it is at a logic low) and Clock 2 is active-high.

Both Clock 1 and Clock 2 are preferably low swing. The voltage swing of Clock 1 is selected such that transistor 1104 is cut-off when Clock 1 is high and sufficiently conductive when Clock 1 is low to provide satisfactory speed for the intended applications. Therefore, Clock 1 swings between $V_{DD}$ (or near $V_{DD}$) and voltage $V_{LOW}$ where $V_{LOW}$ is substantially above GND.

The voltage swing of Clock 2 is chosen such that transistor 1138 is cut-off when Clock 2 is low and reasonably conductive when Clock 2 is high. Therefore, Clock 2 swings from GND (or near GND) and voltage $V_{HIGH}$, where $V_{HIGH}$ is substantially below $V_{DD}$.

Logically, this circuit operates in the same way that a regular dynamic logic gate operates. The circuit is precharged when Clock 1 is low and Clock 2 is low. This causes the output signal Out to be precharged to $V_{DD}$.

The circuit evaluates its logic function when Clock 1 is high and Clock 2 is high. When the evaluation phase occurs, then the output signal Out is discharged to GND if there is a conducting path of transistors between output 1106 and GND. Whether a path exists or not depends on the logic input signals A at input 1108, B at input 1120, C at input 1112, D at input 1124, and E at input 1130.

The use of low-swing clocks saves a substantial amount of power consumption in the clock system compared to a standard dynamic logic gate. In some configurations which we have used, $V_{DD}$ is 5 V, Clock 1 applied to input 1102 swings between voltages 2.5 V and 5 V, and Clock 2 applied to input 1136 swings between voltages 0 V and 2.7 V. The optimal voltage swings, transistor sizes, and other parameters are dependent upon the particular design and fabrication technology.

The precharge time will be longer than in a standard dynamic logic gate if transistor 1104 has a standard width. The system designer can make this increase have little effect on the critical path delay or cycle time. Transistor 1138 is made enough wider than in the standard dynamic logic gate that the discharge time remains fast.

Figure 12:
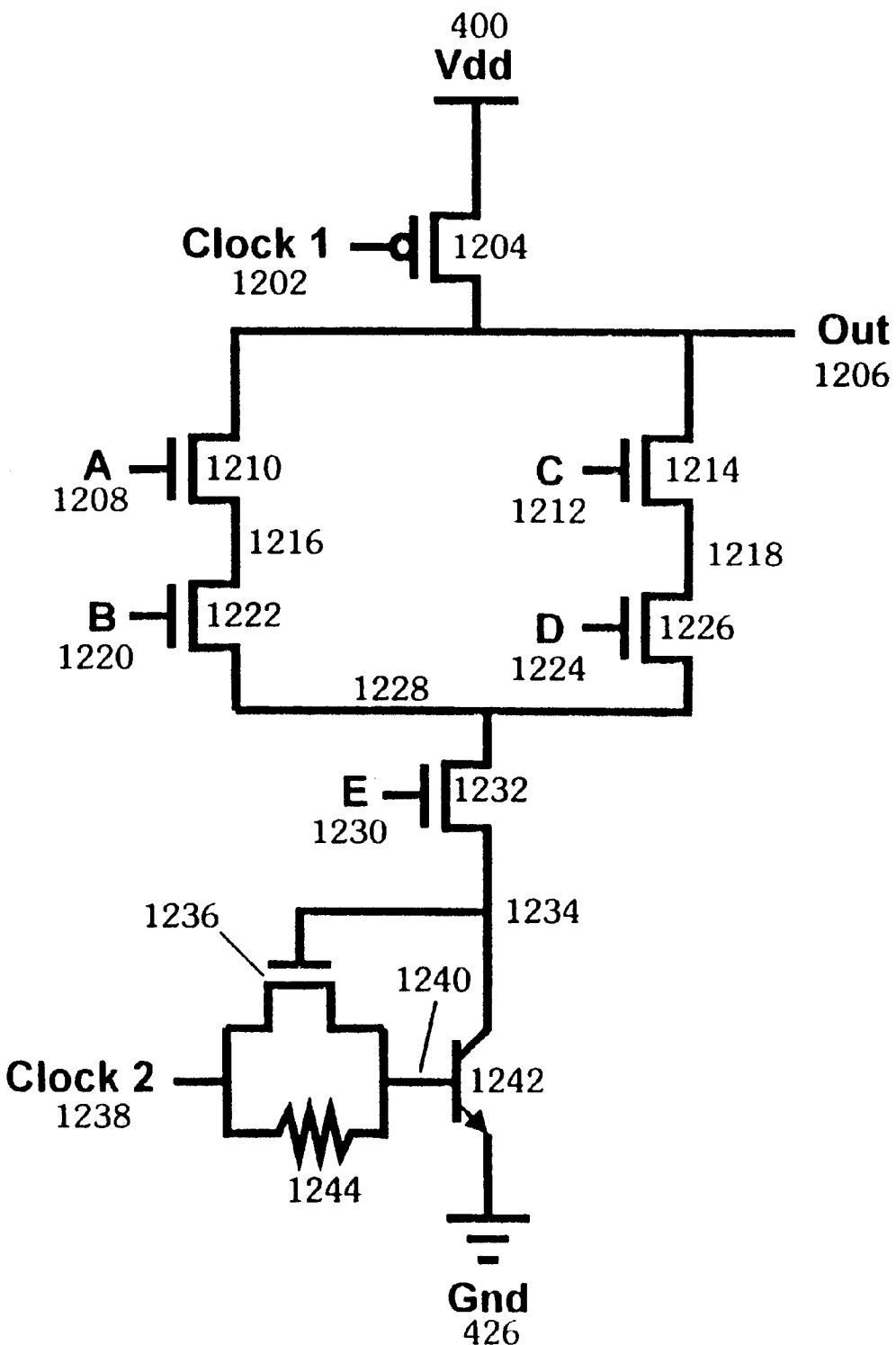
FIG. 12 illustrates a bi-CMOS dynamic logic gate that can be clocked using a low-swing clock signal.

FIG. 12 presents a bi-CMOS dynamic logic gate that is modified to enable the use of low-swing clocks. This circuit is similar to the CMOS dynamic logic gate shown in FIG. 11 except that NMOS transistor 1138 in FIG. 11 has been replaced by a three-element circuit consisting of NPN transistor 1242, NMOS transistor 1236, and resistor 1244.

This three-element circuit acts in a similar way as the three element circuit consisting of elements 922, 930 and 936 in the bi-CMOS LPCI latch in FIG. 9. NPN transistor 1242 controls the conductive state of the conducting path between node 1234 and GND depending on the voltage of Clock 2. Resistor 1244 limits the current drawn from Clock 2 when transistor 1242 is saturated. NMOS transistor 1236 helps increase the speed of discharging node 1234 to GND when Clock 2 goes high.

The use of low-swing clocks saves a substantial amount of power consumption in the clock system compared to a standard dynamic logic gate. In some configurations which we have used, $V_{DD}$ is 5 V, Clock 1 swings between voltages 2.5 V and 5 V, and Clock 2 swings between voltages 0 V and 1.2 V. The optimal voltage swings, transistor sizes, resistor values, and other parameters are dependent upon the particular design and fabrication technology.

Clock Drivers and Clock Power Supplies

Figure 13:
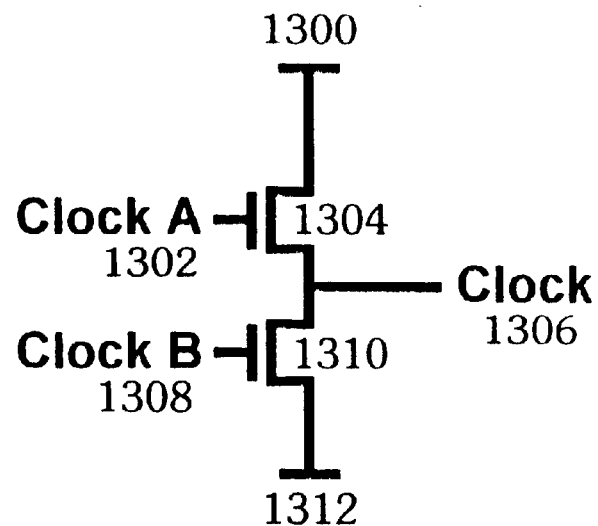
FIG. 13 illustrates an NMOS push-pull driver that can be used to drive a low-swing clock signal.
Figure 14:
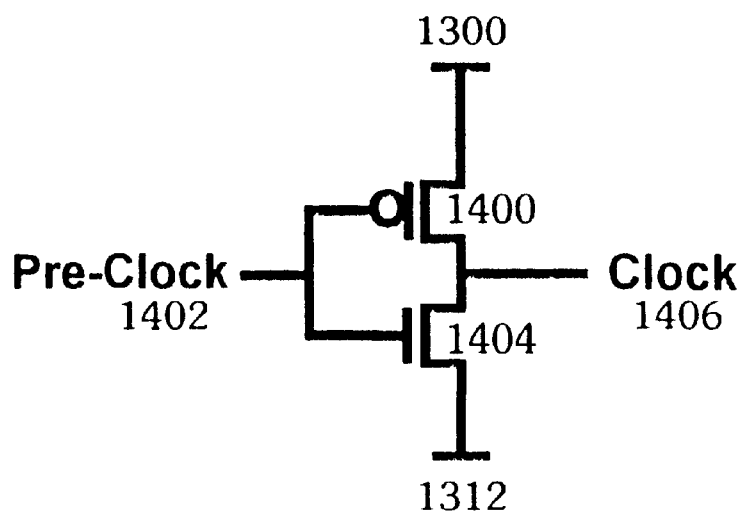
FIG. 14 illustrates a CMOS inverter driver that can be used to drive a low-swing clock signal.

In a CMOS technology, low-voltage clocks can be driven using a final driver stage of either a CMOS inverter circuit (illustrated in FIG. 14) or an NMOS push-pull driver (illustrated in FIG. 13). In the CMOS driver shown in FIG. 14, transistor 1400 charges the low-voltage clock signal 1406 to the voltage supply for the clock high level applied to input 1300. Transistor 1404 charges the low-voltage clock signal 1406 to the voltage supply for the clock low level 1312. The gates of transistors 1400 and 1404 are driven by the pre-driver clock 1402 which is logically inverted from the final low-voltage clock signal 1406.

Pre-driver clock 1402 is generally a full-swing signal generated by pre-driver circuitry. One common type of pre-driver circuit is an amplifier consisting of a series of CMOS inverters where each stage scales up in size from the previous stage. This amplifier is used to amplify a clock signal sufficiently to control the final driver stage.

In the NMOS driver shown in FIG. 13, transistor 1304 is used to charge the low-voltage clock signal 1306 to the voltage supply for the clock high level 1300. Transistor 1310 is used to charge the low-voltage clock signal 1306 to the voltage supply for the clock low level 1312. The gate of transistor 1304 is driven by pre-driver clock A applied to input 1302. The gate of transistor 1310 is driven by pre-driver clock B applied to input 1308.

Pre-driver clock A has the same logic sense as the final low-voltage clock signal produced at output 1306, while pre-driver clock B 1308 is logically inverted from the output low-voltage clock signal 1306. Pre-driver clock A and pre-driver clock B are generally full-swing signals generated by pre-driver circuitry. One common type of pre-driver circuitry is an amplifier consisting of a series of CMOS inverters where each stage scales up in size from the previous stage. The pre-driver design can be implemented such that pre-driver clocks A and B are non-overlapping in order to minimize or eliminate short-circuit current through the final driver stage shown in FIG. 13.

The NMOS push-pull driver is significantly more compact when the voltage supply at the Clock high level 1300 is only about ½ of the regular supply voltage $V_{DD}$. For typical voltage levels, it is usually recommended to use an NMOS push-pull driver when using the CMOS LPCI latch. A CMOS inverter driver is usually recommended when using the CMOS LPPT latch to achieve minimum driver size and power consumption.

When using the bi-CMOS LPCI latch, either an NMOS push-pull driver, a CMOS inverter, or a bipolar driver design can be used.

System power savings are maximized by generating the clock voltage supplies efficiently. Power supply design is outside the scope of this invention, so the methods are not discussed here.

If the clock power supplies are created on-chip by a simple, relatively inefficient method of stepping down full-voltage supplies to the levels of the low-voltage clock(s), the power savings will likely be reduced. However, even if that is done, the overall power savings can still be substantial in some cases.

Special Method of Generating a Low Voltage Supply for LPCI Latches

Figure 15:
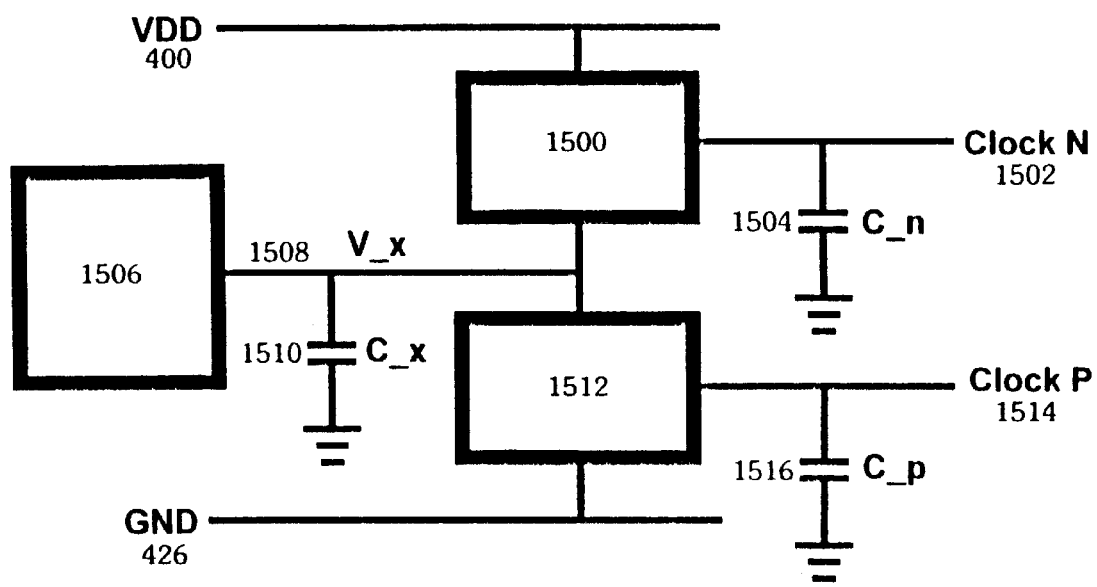
FIG. 15 illustrates a special method of generating a low-voltage supply using clock networks as charge pumps.

FIG. 15 presents an example of a method for generating a low supply voltage using clock networks as charge pumps. This method can be applied when both positive and negative CMOS LPCI latches are used in a circuit design.

In this case, there is a possibility that both latches share a supply voltage $V_X$ supplied to input 1508 where $V_X$ is often nominally $V_{DD}/2$ where the voltage $V_{DD}$ applied to input 400 is the full supply voltage. In this case, the positive-transparent LPCI latches use a clock voltage swing between GND and $V_X$, and the negative-transparent LPCI latches use a clock voltage swing between $V_X$ and $V_{DD}$. The voltage supply 1506 for $V_X$ is a source of current for the clock driver 1512 for the positive-transparent latches and a sink of current for the clock driver 1500 for the negative-transparent latches. Therefore, if a sufficiently large capacitor 1510 of capacitance $C_X$ is placed on the supply rail for the voltage $V_X$ applied to conductor 1508, then the voltage generator 1506 for $V_X$ only has to source the difference between the average current consumption of the two clock networks.

This can be conceptualized as follows. Charge is transferred first from the voltage $V_{DD}$ applied via input 400 to rail 1508 through the negative-transparent clock driver 1500 and clock network 1502. Then charge is transferred from the rail 1508 to GND via the positive-transparent clock driver 1512 and clock network 1514. Rail 1508 supplies the intermediate supply voltage $V_X$. A voltage generator 1506 keeps the supply voltage $V_X$ on rail 1508 at or near a nominal voltage, thereby compensating for the difference in current consumption of the two clock networks.

In many cases, the capacitances of the two networks will be nearly equal. The voltage generator 1506 can then be designed according to a simple scheme such as stepping down voltage from the full rails $V_{DD}$ and GND with minimal impact on the total power consumption.

In general, the capacitances of the two networks will not be exactly equal for the following reasons: differences in design of the two clock networks, process variations in fabrication of components such as NMOS and PMOS transistors; the use of gated clock signals; and/or variation in capacitance of each clocked transistor, depending on the voltages of the source and drain of the transistor.

If the following were true, then the voltage $V_X$ of rail 1508 would actually stabilize at the voltage $(V_{DD}*C_P)/(C_N+C_P)$:

- no voltage source 1506 is used (i.e. rail 1508 is only connected to the clock drivers 1500 and 1510);
- the parasitic capacitance of the clocking network of positive-transparent latches is the capacitance $C_P$ of capacitor 1516;
- the parasitic capacitance of the negative-transparent latches is the capacitance $C_N$ of capacitor 1504; and
- a large capacitor 1510 of capacitance $C_X$ that is much larger than the capacitance $C_N$ of capacitor 1504 and the capacitance $C_P$ of capacitor 1516 is placed on the supply rail 1508.

If the capacitances $C_N$ of capacitor 1504 and $C_P$ of capacitor 1516 vary during operation, then the voltage $V_X$ of rail 1508 will drift accordingly.

In some cases, this voltage variation is acceptable. In other cases, an active voltage source 1506 should be used to keep the voltage $V_X$ on rail 1508 within a specified range $V_{XHIGH}$ to $V_{XLOW}$. To save as much power as possible, the voltage source should only charge the rail when $V_X$ is outside of the specified range. Ideally, the range should be large enough to accommodate the normal fluctuations in voltage as different clocking networks switch during one clock cycle.

For example, suppose the entire positive-transparent clocking capacitance $C_P$ of capacitor 1516 is charged starting from zero volts to the voltage $V_X$ of rail 1508. If the original voltage on rail 1508 was $V_{XOLD}$, then the new voltage $V_{XNEW}$ on the rail is equal to $(V_{XOLD}*C_X)/(C_X+C_P)$. A similar formula applies if the entire negative-transparent clocking network switches. Ideally, the storage capacitance $C_X$ of capacitor 1510 is much larger than the capacitance $C_P$ of capacitor 1504 and the capacitance $C_n$ of capacitor 1516 so that the voltage fluctuation is small.

Theoretically, the storage capacitance $C_X$ of capacitor 1510 can be implemented using some off-chip capacitance as well as on-chip capacitance. However, the inductance of the connection between any off-chip capacitance and the rail 1508 must be kept sufficiently low. Also, the design must avoid possible resonance due to the combination of inductance and capacitance.

In some cases, the designer may wish that the clock swing for the positive-transparent latches be between GND and $V_P$ and the clock swing for the negative-transparent latches be between $V_N$ and $V_{DD}$ where $V_P$ does not exactly equal $V_N$. In this case, it may still be possible to design voltage supplies to take advantage of the principle used above where charge is transferred from $V_{DD}$ to GND through two clocking networks consecutively, thus conserving power.

The Use of Low-swing Signalling with Various Clocking Methodologies

Many designers wish to use a clocking methodology that intrinsically avoids race-through problems. Such methods include:

A. Two-phase non-overlapping clocking using transparent latches;

B. Three or more phase clocking using transparent latches;

C. Single-phase clocking using positive and negative transparent latches discussed in the references (J. Yuan and C. Svensson. "High-Speed CMOS Circuit Technique." February 1989, IEEE Journal of Solid-State Circuits, pp. 62–70, vol. 24, no. 1. and M. Afghahi and C. Svensson. "A Unified Single-Phase Clocking Scheme for VLSI Systems." February 1990, IEEE Journal of Solid-State Circuits, pp. 225–233, vol. 25, no. 1); and D. Single-phase clocking using edge-triggered registers.

Our low-swing clocking methods directly support methods 1 and 2 using the positive-transparent latches presented above. When the CMOS LPPT latch is used, the positive and negative-transparent latches can both use the same single-phase clock, thus supporting method 3 above.

To apply method 3 to CMOS LPCI latches is more difficult, because the positive and negative-transparent versions of the CMOS LPCI latch require different clock voltage levels. Thus, two separate clock signals are required. The second clock signal can either be generated locally or globally. The resulting design might not be better than using only positive-transparent latches and two-phase clocking.

In addition to the above methods that are resistant to race-through, the low-swing clocking techniques presented herein can also be applied to single-phase clocking using only positive or negative-transparent latches.

Clock line capacitance may often be reduced in some of our low-voltage swing CMOS clocking methods by mostly or solely using positive-transparent latches in the clock system. Negative-transparent latches connect PMOS transistors to the clock line. This can place a greater capacitive load on the clock line because the PMOS transistors are often wider than the corresponding NMOS transistors in the positive-transparent latches.

Global Design

Using these low-swing clocking methods requires only minimal alterations of normal design practices.

In many designs, no shielding of the clock lines may be needed because of the following:

(a) the possible capacitively-coupled noise is small because the clock lines in the design have a very large capacitance which makes them resistant to noise capacitively-coupled from other lines, and (b) the low-voltage clock methods presented here have good noise margins.

In other cases, such as when the clock networks are split into a number of separately-driven smaller lines, shielding can be used if desired to help reduce capacitively-coupled noise.

The circuit's power and ground networks should be designed so that ground and power bounce are not large enough to adversely affect the functionality or performance of circuit structures employing low-swing clock signals.

Additional area may be required for accommodating slightly larger latches and possibly for shielding the clock lines. On the other hand, the low voltage swing makes the clock driver more compact and reduces the ground bounce from driving the clock capacitance, thus helping to meet ground bounce requirements.

Preferred Embodiments of Latches

Any of the described embodiments of latches may be preferred under certain circumstances, depending in part on the following factors:

(a) the speed and power consumption of the various schemes in the specific fabrication technology being used; and (b) the clocking methodology and design style considerations.

Purely as an example, simulations of the above structures were executed in HP CMOS26 fabrication technology (available through MOSIS). For the bi-CMOS process, the HP CMOS26 process was used plus some moderate speed (fT=6 Ghz) bipolar transistors. The following discussion and performance numbers were provided by those simulations.

To minimize the cycle time, the most important two parameters from the table are the setup time and the propagation delay from input to output. Based on those parameters, the latches are ranked in the following list. If a signal passes through two latches per clock cycle, the times given are the relative nominal clock cycle lengths compared to using the standard Yuan-Svensson latch, based on the nominal data given in the table.

I. Proposed CMOS LPPT latch −0.21 ns

II. Standard 3-transistor CMOS latch based on pass transistor −0.12 ns

III. Standard Yuan-Svensson CMOS latch based on clocked inverters 0.00 ns

IV. Proposed CMOS LPCI latch +0.11 ns

V. Proposed bi-CMOS LPCI latch +0.15 ns

This table is constructed assuming that all logic paths between latch stages are designed to propagate starting from one latch before the end of a transparent period to another latch before the end of the next transparent period. If some extra-long logic path requires propagation from the beginning of one transparent period to the end of the next transparent period ("early-to-late timing"), then the Clock to Out delay becomes important and the relative cycle times should be recalculated.

All the cycle times in the list are relatively close if the total cycle time is about 10 ns or more. For a cycle time of 5 ns or less, the relative speeds may become quite important.

| Specifications All times are in nsec. | Standard Yuan-Svensson CMOS latch based on clocked inverters | Proposed low clock voltage CMOS latch based on clocked inverters (LPCI Latch) | Standard 3-transistor dynamic CMOS latch based on NMOS pass transistor | Proposed low clock voltage CMOS latch based on pass transistor (LPPT latch) | Proposed low clock voltage bi-CMOS latch based on clocked inverters (LPCI Latch) |
|---|---|---|---|---|---|
| Clock voltage high and low | 5 V 0 V | 2.5 V 0 V | 5 V 0 V | 4.3 V 0.8 V | 1.2 V 0 V |
| Rough estimate of clock power consumption ratio compared to standard Yuan-Svensson latch | 1.00 | 0.46 | 0.67 | 0.41 | 0.22 |
| Clock to Out | 0.29 ns | 0.41 ns | 0.24 ns | 0.30 ns | 0.85 ns |
| Setup time for In | 0.50 ns | 0.60 ns | 0.50 ns | 0.35 ns | 0.55 ns |
| Hold time for In | 0.05 ns | −0.05 ns | 0.20 ns | 0.15 ns | 0.75 ns |
| In to Out | 0.36 ns | 0.37 ns | 0.24 ns | 0.30 ns | 0.46 ns |
| Minimum clock pulse width | 0.25 ns | 0.50 ns | 0.40 ns | 0.30 ns | 1.20 ns |
| Minimum In pulse width | 0.50 ns | 0.45 ns | 0.65 ns | 0.50 ns | 1.30 ns |

Timing numbers are technology-dependent. The above times are simulated numbers using HP CMOS26 parameters plus some moderate speed bipolar transistors using Berkeley SPICE (version 3f2). Positive-transparent latches were used. The simulated temperature is 27° C., and the transistor parameters are nominal. In this technology, the bi-CMOS LPCI latch is slower, but might be better in a different technology with faster bipolar transistors.

Based on the data in the above table plus the analysis of dynamic logic gates and clocking methodologies, some recommendations can be made. These recommendations are based on the simulations performed in this specific technology. The results are dependent upon the fabrication technology used.

The relative power consumptions are estimated in the table. The lowest clock power latch is the bi-CMOS LPCI latch. However, that latch has a significant charge sharing concern that may make it unsuitable in some cases. Simulations of one typical configuration using $V_{DD}$=5 V show that output signal Out produced on output 912 can drop as low as 3.7 V when charge sharing occurs. In some cases, this may cause some static power consumption in subsequent logic which takes output signal Out as a logic input.

The second lowest clock power latch is the CMOS LPPT latch. Since it is also the fastest latch in the group, we can recommend it highly. Another advantage is that positive and negative transparent versions can use the same clock line as discussed previously.

The CMOS LPCI latch is also a good choice. It can share clock lines with CMOS dynamic logic gates that use low-swing clocks. If both positive and negative-transparent LPCI latches are used, the efficient method of generating an intermediate supply voltage shown in FIG. 15 can be used. However, the negative transparent LPCI latches require different clock voltage levels as discussed earlier, so two clock signals must be distributed to latches to implement a clocking scheme that avoids race-through problems. This may present more clock skew problems than a scheme that can use a single clock for all latches.

Low clock power dynamic logic gates require two different clock signals. Since the skew of clocks used for dynamic logic is not as critical to performance, this is not a major problem.

The total clock wiring capacitance tends to be less when fewer clock signals are used. However, the clock power consumption needs to be examined quantitatively for particular designs. For example, suppose positive-transparent CMOS LPCI latches are used in one chip. If low clock-power bi-CMOS dynamic logic gates are used, two additional clock signals may be required, but if low clock-power CMOS dynamic logic gates are used, only one additional clock signal is required. Although routing two clock signals adds more capacitance than one, the swing of one of the bi-CMOS clock signals is very small, so power may actually be lower overall.

One last consideration is that fewer signal voltage levels may simplify power supply generation.

Mostly for the purposes of writing claims, we provide here a few technical definitions of clock signals.

A clock signal is called a storage element clock signal if the clock signal is carried on a line that is connected to a clock input of at least one storage element in a circuit.

In a circuit, one global storage element clock signal comprises all storage element clock signals which have approximately the same clock phase and frequency, logical sense, and approximately the same high and low voltage levels, even if the signals are generated by separate clock sources. These storage element clock signals might or might not be created by separate drivers, amplifiers, or by conditional gating structures which sometimes block the clock signals on selected lines, or by other circuits. If one storage element clock signal has approximately the same phase and frequency and approximately the same high and low voltage levels but opposite logical sense (inverted logically) as another storage element clock signal, the two storage element clock signals are considered to belong to two separate global storage element clock signals. Two storage element clock signals are considered to have approximately the same phase and frequency and approximately the same high and low voltage levels if interchanging the phase, frequency, and voltage levels of one signal with the phase, frequency, and voltage levels of the second signal does not degrade the circuit's performance or functionality (in this test, any conditional gating of the clock signals is NOT interchanged, of course).

A main global storage element clock signal of a circuit is a global storage element clock signal which is connected to a clock input of at least 10% of the storage elements, excluding RAM array structures, of the circuit. RAM array structures, such as on-chip caches, are excluded because they often contain vast numbers of storage elements which are not directly connected to any clock signal.

A useful measurement of the complexity of a circuit's clocking system is the number of main global storage element clock signals in the circuit. A circuit which has only one main global storage element clock signal is said to use only a single main global storage element clock signal. A circuit which has two main global storage element clock signals is said to use only two main global storage element clock signals. Etc. This number can give some indication of the difficulty of designing the clocking network to meet performance requirements and can also give some indication of the amount of wiring and logic required by the circuit's clocking system.

Conclusions, Ramifications, and Scope of Invention

The innovative concepts disclosed in the present application can be applied in a wide variety of contexts. The preferred implementations can be modified in many ways. The modifications and variations described above and below are merely illustrative. These examples help to show some of the scope of the inventive concepts, but these examples do not nearly exhaust the full scope of variations in the disclosed novel concepts. A few example variations are as follows:

The methods that we have described can use a variety of methods of generating and distributing the low-voltage clocks and power supplies.

Different types of latches, flip-flops, or other storage elements could be used. For example, storage elements with logic functions at the input or MUX inputs or storage elements providing the ability for scan-based testing could be used. As an illustration, a number of variants of the Yuan-Svensson latches are provided in a 1992 paper D. W. Dobberpuhl, R T. Witek, et al. "A 200-Mhz 64-b Dual-Issue CMOS Microprocessor." November 1992, IEEE Journal of Solid-State Circuits, pp. 1555–1568, vol. 27, no. 11.

Different configurations of latches, flip-flops, or other storage elements could be used.

Different types and configurations of dynamic logic could be used.

Different methods of gating clock signals could be used.

This method can be combined with power-efficient methods of generating and distributing the clock signal(s).

Different clocking methodologies (e.g. single-phase clocking, two-phase clocking, multi-phase clocking, latch-based design, or edge-triggered register-based design) can be used in conjunction with low-voltage clocking.

This method can be applied to different types of logic design techniques such as static vs. dynamic logic or gate vs. pass transistor logic.

This method can be applied to logic families and fabrication technologies other than those described here (CMOS and bi-CMOS are described here).

These techniques can be applied in the design of many different types of digital circuits and mixed analog/digital systems such as microprocessors, digital signal processors, video codecs, and telecommunications processors. In addition, low-voltage signalling techniques can be applied in bus signalling, network signalling, and telecommunications signalling.

In conclusion, we have described an innovative method of reducing the power consumption of digital circuits and subsystems using low-voltage clock signals. As example embodiments, novel storage element and dynamic logic designs have been described in both CMOS and bi-CMOS. Using this method, power consumption can be reduced substantially with little or no penalty in performance.

What is claimed is:

1. A storage element comprising:
   a combinational logic element (708, 716; 804, 812) having a storage node (706; 814) as input and having an output (714; 810) on which is produced an output signal OUT;
   a transistor (712; 808) having a clock (704; 802) input for reception of a low-voltage swing clock, an input for receiving an input signal IN and an output connected to said storage node (706; 814); and
   a pullup/pulldown means (702; 816) having an input for application of a supply voltage ($V_{DD}$; GND) and having an output connected to said storage node (706; 814) for pulling said storage node (706; 814) to said supply voltage ($V_{DD}$; GND);
   wherein said low-voltage swing clock has a voltage swing at least 10% smaller than the voltage swing of a normal logic signal,
   whereby, in spite of the reduced amplitude of the clock signal, said storage node is pulled to said supply voltage ($V_{DD}$, GND) by said pullup/pulldown means, and
   whereby the clock power consumption of said storage element is reduced compared to a storage element using a full voltage swing clock.

2. A digital storage element as in claim 1 wherein said pullup/pulldown means (702) is a pullup transistor.

3. An integrated circuit comprising:
   means for carrying a main global storage element clock signal of low-voltage swing, and
   a plurality of storage elements that each receive a low-voltage swing clock signal,
   wherein the total number of main global storage element clock signals of low voltage-swing is three or fewer,
   wherein said main global storage element clock signal of low-voltage swing has a voltage swing at least 10% smaller than the voltage swing of a normal logic signal,
   whereby this small number of main global storage element clock signals reduces the complexity and power consumption of the low-voltage clocking system.

4. An integrated circuit comprising:
   a storage element that receives one and only one clock signal (512;612;704;802;926), wherein said clock signal is low voltage-swing,
   wherein said clock signal has a voltage swing at least 10% smaller than the voltage swing of a normal logic signal,
   whereby this use of one and only one clock signal in said storage element reduces clock power consumption, reduces design complexity and reduces clock capacitance,
   whereby the clock power consumption of said integrated circuit is reduced compared to using a storage element that receives two or more clock signals or using a storage element that is clocked by a full voltage swing clock signal.

5. An integrated circuit comprising:
   a storage element that contains one and only one clocked transistor (712; 808) wherein said clocked transistor receives a low voltage-swing clock signal (802; 704)
   wherein said low voltage-swing clock signal has a voltage swing at least 10% smaller than the voltage swing of a normal logic signal,
   whereby said storage element has less clock capacitance than a storage element containing two or more clocked transistors,
   whereby the clock power consumption of said integrated circuit is reduced compared to a storage element that contains two or more clocked transistors or that receives a full voltage swing clock signal.

6. A storage element comprising:
   a first clocked transistor (514; 614; 712; 808; 930);
   a low voltage swing clock signal that is applied to a control terminal (512; 612; 704; 802; 926) of said first clocked transistor (514; 614; 712; 808; 930), and that is the only clock signal that is applied to said storage element,
   wherein said clock signal has a voltage swing at least 10% smaller than the voltage swing of a normal logic signal,
   whereby the clock power consumption of said storage element is reduced and the clock capacitance is minimized.

* * * * *